United States Patent
Saito et al.

(10) Patent No.: US 8,471,367 B2
(45) Date of Patent: Jun. 25, 2013

(54) SEMICONDUCTOR DEVICE AND METHOD FOR MANUFACTURING SEMICONDUCTOR DEVICE

(75) Inventors: Daishiro Saito, Toyama (JP); Takayuki Kai, Kyoto (JP); Takafumi Okuma, Osaka (JP); Hitoshi Yamanishi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/377,940

(22) PCT Filed: Nov. 1, 2010

(86) PCT No.: PCT/JP2010/006426
§ 371 (c)(1),
(2), (4) Date: Dec. 13, 2011

(87) PCT Pub. No.: WO2011/058712
PCT Pub. Date: May 19, 2011

(65) Prior Publication Data
US 2012/0104563 A1  May 3, 2012

(30) Foreign Application Priority Data
Nov. 12, 2009 (JP) ................... 2009-258582

(51) Int. Cl.
H01L 23/48 (2006.01)
H01L 29/40 (2006.01)
H01L 23/04 (2006.01)
H01L 23/52 (2006.01)
H01L 21/44 (2006.01)
H01L 21/3205 (2006.01)

(52) U.S. Cl.
USPC ........... 257/621; 257/276; 257/698; 257/754; 257/774; 257/E23.067; 257/E21.294; 257/E23.011; 438/667; 438/666; 438/586; 438/652; 438/657

(58) Field of Classification Search
USPC .......... 257/276, 621, 698, E23.067; 438/667, 438/666
See application file for complete search history.

(56) References Cited

U.S. PATENT DOCUMENTS

| 5,392,189 A | 2/1995 | Fazan et al. |
| 7,256,497 B2 | 8/2007 | Kameyama et al. |

(Continued)

FOREIGN PATENT DOCUMENTS

| JP | 2005-235860 | 9/2005 |
| JP | 2005-277059 | 10/2005 |

(Continued)

OTHER PUBLICATIONS

International Search Report issued Feb. 1, 2011 in International (PCT) Application No. PCT/JP2010/006426.

(Continued)

*Primary Examiner* — Chuong A Luu
*Assistant Examiner* — Cory Eskridge
(74) *Attorney, Agent, or Firm* — Wenderoth, Lind & Ponack, L.L.P.

(57) ABSTRACT

A semiconductor device includes a second oxide film and a pad electrode on a first oxide film that is formed on a front surface of a semiconductor substrate, a contact electrode and a first barrier layer formed in the second oxide film and connected to the pad electrode, a silicide portion formed between the contact electrode and a through-hole electrode layer and connected to the contact electrode and the first barrier layer, a via hole extending from a back surface of the semiconductor substrate to reach the silicide portion and the second oxide film, a third oxide film formed on a sidewall of the via hole and on the back surface of the semiconductor substrate, and a second barrier layer (H) and a rewiring layer formed inside the via hole and on the back surface of the semiconductor substrate and connected to the silicide portion.

15 Claims, 26 Drawing Sheets

U.S. PATENT DOCUMENTS

| | | |
|---|---|---|
| 7,759,247 B2 * | 7/2010 | Kameyama et al. .......... 438/666 |
| 2005/0230804 A1 | 10/2005 | Tanida et al. |
| 2006/0108691 A1 * | 5/2006 | Kameyama et al. .......... 257/758 |
| 2007/0080457 A1 | 4/2007 | Tanida et al. |
| 2008/0121960 A1 * | 5/2008 | Ohuchi ......................... 257/296 |
| 2008/0284041 A1 * | 11/2008 | Jang et al. .................... 257/774 |
| 2009/0108464 A1 * | 4/2009 | Uchiyama ..................... 257/774 |

FOREIGN PATENT DOCUMENTS

| | | |
|---|---|---|
| JP | 2006-128352 | 5/2006 |
| JP | 2008-288595 | 11/2008 |

OTHER PUBLICATIONS

International Preliminary Report on Patentability issued Jun. 21, 2012 in International (PCT) Application No. PCT/JP2010/006426.

Chinese Office Action, with partial English translation, issued Feb. 5, 2013 in counterpart Chinese Patent Application 201080004901.8.

\* cited by examiner

SEMICONDUCTOR DEVICE AND METHOD FOR MANUFACTURING SEMICONDUCTOR DEVICE

TECHNICAL FIELD

The present invention relates to a semiconductor device having a through-hole electrode layer formed in a semiconductor substrate, and a manufacturing method of the semiconductor device.

BACKGROUND ART

In recent years, miniaturization is demanded of a package (a semiconductor device) in an integrated circuit used in an electronic device. As one example of achieving miniaturization, a through-hole electrode penetrating through a semiconductor substrate is replacing conventional wire bonding.

FIG. 17 is a cross-sectional view showing one example a conventional semiconductor device.

In FIG. 17, a semiconductor device 101 is substantially structured with a semiconductor substrate 102 made of silicon or the like, a via hole 107, a second oxide film 109, a barrier layer 110, and a rewiring layer 111. The via hole 107 extends from a back surface 102b of the semiconductor substrate 102 to reach a pad electrode 105. The second oxide film 109 is formed on the sidewall of the via hole 107 and on the back surface 102b of the semiconductor substrate 102. The barrier layer 110 and the rewiring layer 111 are formed inside the via hole 107 and on the back surface 102b of the semiconductor substrate 102.

FIG. 18 is a flowchart showing a manufacturing method of the conventional semiconductor device. FIGS. 19 to 26 are each a cross-sectional view showing the state at each step in the manufacturing method of the conventional semiconductor device.

First, as shown in FIG. 19, on a first oxide film 106 on a front surface 102a of the semiconductor substrate 102 where a circuit (not shown) is formed, the pad electrode 105 and a passivation film 104 are formed. Thereafter, on the passivation film 104, a supporting substrate 103 is attached through an adhesive (not shown) (step S101 in FIG. 18).

Next, as shown in FIG. 20, on the back surface 102b of the semiconductor substrate 102, a resist 112 is formed for providing an opening at a position corresponding to the pad electrode 105 (step S102 in FIG. 18).

Then, as shown in FIG. 21, by etching the semiconductor substrate 102 using the resist 112 as an etching-purpose mask, the via hole 107 reaching the first oxide film 106 is formed (step S103 in FIG. 18).

Subsequently, as shown in FIG. 22, by etching the first oxide film 106 using the resist 112 as an etching-purpose mask, the via hole 107 reaching the pad electrode 105 is formed (step S104 in FIG. 18).

Next, as shown in FIG. 23, the resist 112 on the back surface 102b of the semiconductor substrate 102 is removed therefrom (step S105 in FIG. 18).

Then, as shown in FIG. 24, the second oxide film 109 is formed inside the via hole 107 and on the back surface 102b of the semiconductor substrate 102 (step S106 in FIG. 18).

Next, as shown in FIG. 25, by etching the second oxide film 109 at the bottom of the via hole 107, the pad electrode 105 is exposed again (step S107 in FIG. 18).

Subsequently, as shown in FIG. 26, the barrier layer 110 and the rewiring layer 111 are formed on the second oxide film 109 in order (step S108 in FIG. 18).

The pad electrode 105 is electrically connected to the back surface 102b of the semiconductor substrate 102 through a through-hole electrode 108 which is structured with the barrier layer 110 and the rewiring layer 111.

The pad electrode 105 and the through-hole electrode 108 contact each other by a contact area corresponding to a diameter of the via hole 107. The resistance value between the bad electrode 105 and the through-hole electrode 108 is determined by the contact area (for example, see Patent Literature 1).

With the conventional semiconductor device, for example, in a case where the pad electrode 105 is reduced in size for the purpose of achieving miniaturization of a chip, the diameter of the via hole 107 must be reduced accordingly. As a result, the aspect ratio of the via hole 107 is increased, and the manufacturing cost increases.

CITATION LIST

Patent Literature

Patent Literature 1: Japanese Unexamined Patent Publication No. 2005-235860

SUMMARY OF THE INVENTION

Technical Problem

With the conventional structure, the resistance value between the pad electrode 105 and the through-hole electrode 108 is dependent on the diameter of the via hole 107. Accordingly, it involves such an issue that the variations in diameter of the via hole 107 invite fluctuations in the resistance value between the pad electrode 105 and the through-hole electrode 108.

The present invention resolves the conventional issue, and an object thereof is to provide a highly reliable semiconductor device, and a manufacturing method of the semiconductor device, in which the resistance value between the pad electrode and the through-hole electrode layer is independent of the variations in diameter of the via hole, and variations in resistance value are small.

Solution to Problem

In order to achieve the object described above, the present invention is structured as follows.

A semiconductor device manufacturing method according to one aspect of the present invention is characterized in comprising:

forming a first insulating film on a front surface of a semiconductor substrate;

forming an electrode section in the first insulating film;

forming a barrier layer that covers the electrode section;

forming a silicide layer that is connected to the electrode section;

forming a via hole penetrating to the front surface from a back surface of the semiconductor substrate;

forming a second insulating film on a sidewall of the via hole and on the back surface of the semiconductor substrate;

etching the second insulating film to expose the silicide layer and the first insulating film in the via hole; and forming a through-hole electrode layer at the second insulating film on the sidewall of the via hole, the second insulating film on the back surface of the semiconductor substrate, the first insulating film on a bottom surface of the via hole, and the silicide layer.

Further, a semiconductor device according to another aspect of the present invention is characterized in comprising:

a first insulating film that is formed on a front surface of a semiconductor substrate;

an electrode section that is formed in the first insulating film and that is covered by a barrier layer;

a via hole penetrating to the front surface from a back surface of the semiconductor substrate;

a second insulating film that is formed on a sidewall of the via hole and on the back surface of the semiconductor substrate;

a through-hole electrode layer formed at the second insulating film on the sidewall of the via hole, the second insulating film on the back surface of the semiconductor substrate, and the first insulating film on a bottom surface the via hole; and a silicide layer that is formed in the first insulating film and between the electrode section and the through-hole electrode layer, and that is connected to the electrode section and to the through-hole electrode layer, wherein a relationship between a width A of the silicide layer and a width B of a bottom of the via hole in a cross section taken along a plane including a center axis of the via hole satisfies $A \leq B$.

Effects of the Invention

As described in the foregoing, according to a semiconductor device and a semiconductor device manufacturing method of the present invention, the resistance value between the pad electrode and the through-hole electrode layer is independent of variations in diameter or in the width of the via hole. Therefore, a highly reliable semiconductor device with small variations in resistance value, and a manufacturing method of the semiconductor device can be provided.

BRIEF DESCRIPTION OF THE DRAWINGS

These and other aspects and features of the present invention will become clear from the following description taken in conjunction with the preferred embodiments thereof with reference to the accompanying drawings, in which.

DESCRIPTION OF EMBODIMENTS

In the following, with reference to the drawings, description will be given of an embodiment of the present invention. It is to be noted that, in the following description, identical symbols are allotted to the identical structures, and the description thereof will not be provided as necessary.

First Embodiment

Figure 1:
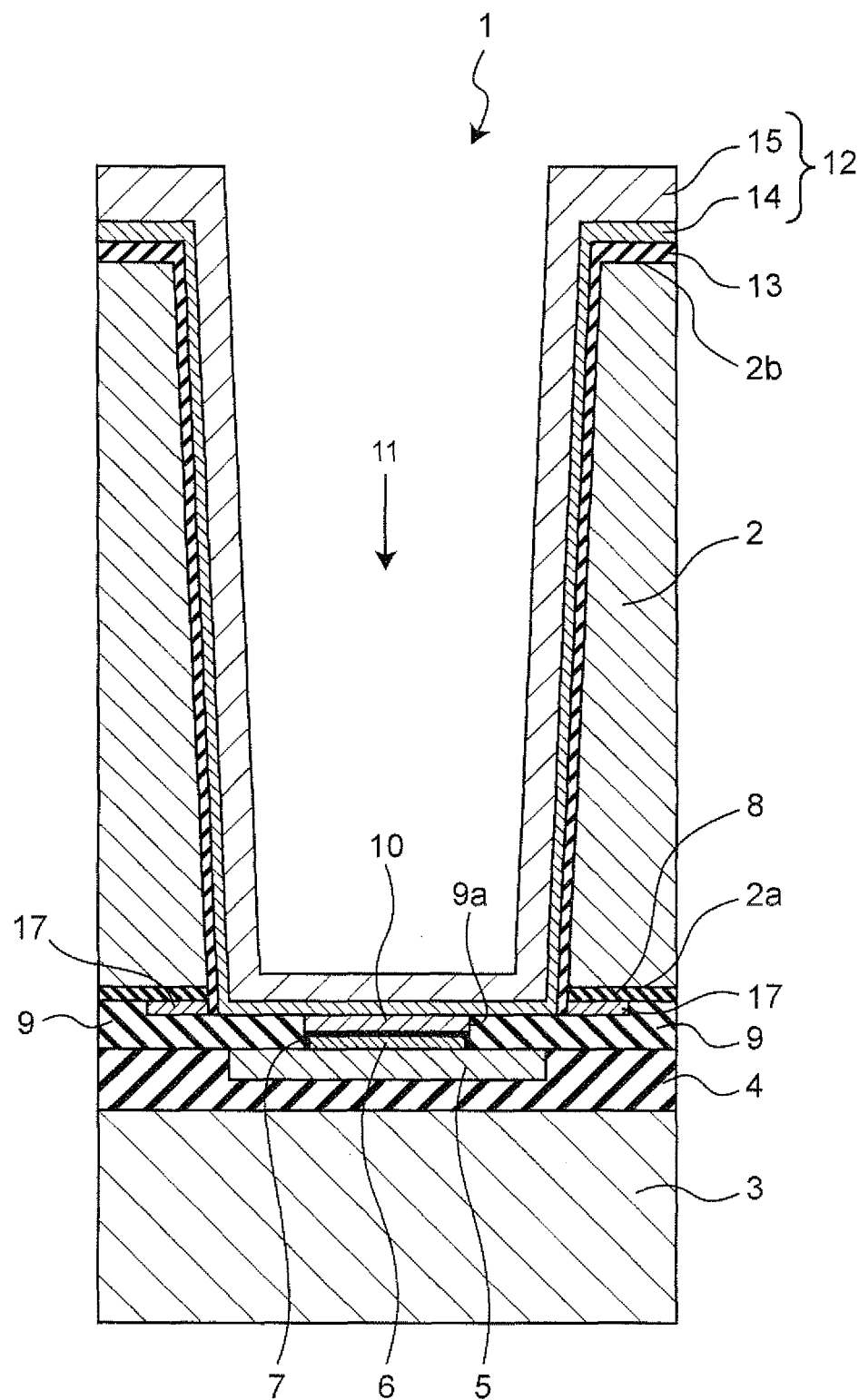
FIG. 1 is a cross-sectional view of a semiconductor device according to a first embodiment of the present invention.

FIG. 1 is a cross-sectional view of a semiconductor device according to a first embodiment of the present invention.

In FIG. 1, a semiconductor device 1 according to the first embodiment is structured to include a semiconductor substrate 2, a pad electrode 5, a contact electrode 6, a first oxide film 8, a second oxide film 9, a third oxide film 13, a silicide portion 10, a via hole 11, a first barrier layer 7, a second barrier layer 14, and a rewiring layer 15. The contact electrode 6 is one example of an electrode section, and has an external connection terminal. The second oxide film 9 is one example of a first insulating film. The third oxide film 13 is one example of a second insulating film. The silicide portion 10 is one example of a silicide layer. The second barrier layer 14 and the rewiring layer 15 structure a through-hole electrode layer 12.

The second oxide film 9 is formed on the first oxide film 8 that is formed on a front surface 2a of the semiconductor substrate 2. Further, the contact electrode 6 is disposed in a circular hole 9a provided at the second oxide film 9, and is electrically connected to the pad electrode 5 that is provided on the second oxide film 9. The first barrier layer 7 covers the contact electrode 6 so as to enhance adhesion of the second oxide film 9 and the contact electrode 6. The silicide portion 10 is disposed in the circular hole 9a provided at the second oxide film 9 so as to be electrically connected to the first barrier layer 7 covering the contact electrode 6, and is formed between the contact electrode 6 and the through-hole electrode layer 12. The via hole 11 is formed to extend from a back surface 2b of the semiconductor substrate 2 to reach the silicide portion 10 and the second oxide film 9. The third oxide film 13 is formed on the sidewall of the via hole 11 and on the back surface 2b of the semiconductor substrate 2. The second barrier layer 14 and the rewiring layer 15 are formed inside the via hole 11 (i.e., on the sidewall and on the bottom surface) and on the back surface 2b of the semiconductor substrate 2 in order. The second barrier layer 14 contacts the silicide portion 10 to establish an electrical connection therebetween.

The pad electrode 5 and the through-hole electrode layer 12 are electrically connected to each other via the contact electrode 6, the first barrier layer 7, and the silicide portion 10. Further, the pad electrode 5 and the through-hole electrode layer 12 are electrically insulated by the second oxide film 9 at the portion where the contact electrode 6, the first barrier layer 7, and the silicide portion 10 are not interposed.

Further, the semiconductor substrate 2 and the through-hole electrode layer 12 are electrically insulated by the third oxide film 13 formed on the sidewall of the via hole 11 and on the back surface 2b of the semiconductor substrate 2.

Subsequently, description will be given of the materials for the constituents of the semiconductor device 1 according to the first embodiment.

Figure 15:
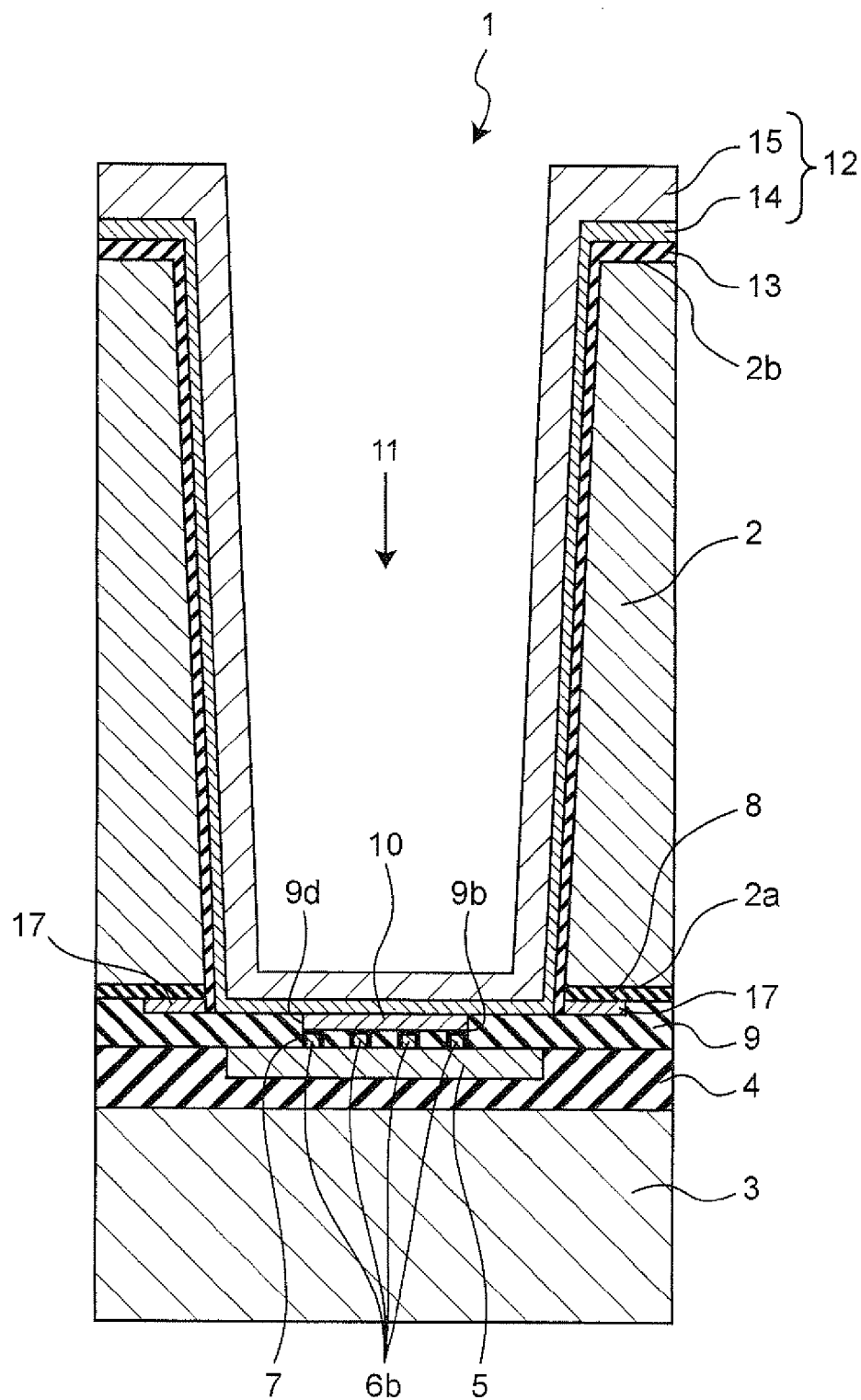
FIG. 15 is a cross-sectional view of a semiconductor device of a first example structured with a plurality of contact members according to the first embodiment.
Figure 16:
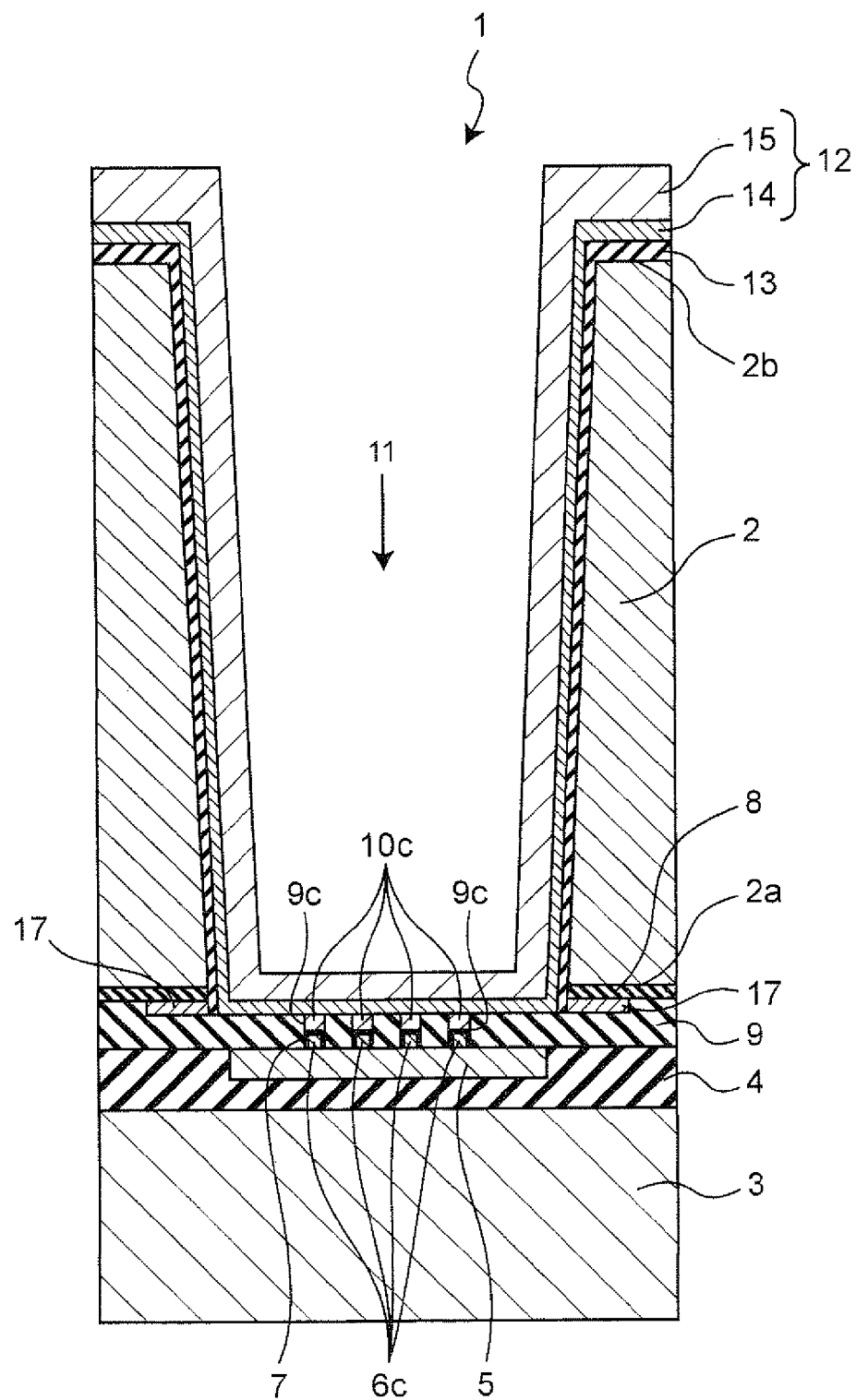
FIG. 16 is a cross-sectional view of a semiconductor device of a second example structured with a plurality of contact members according to the first embodiment.
Figure 17:
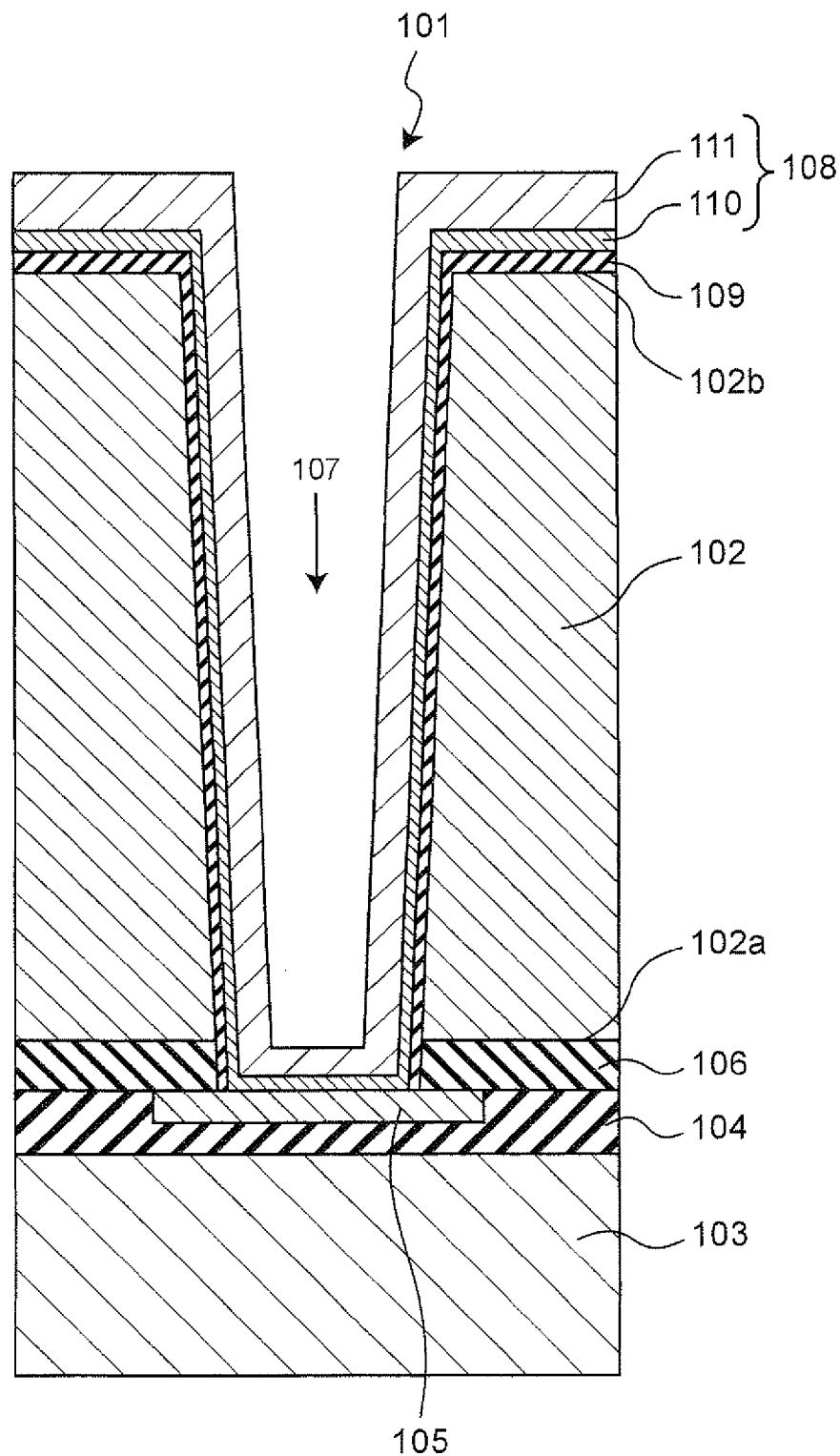
FIG. 17 is a cross-sectional view showing one example of a conventional semiconductor device.
Figure 18:
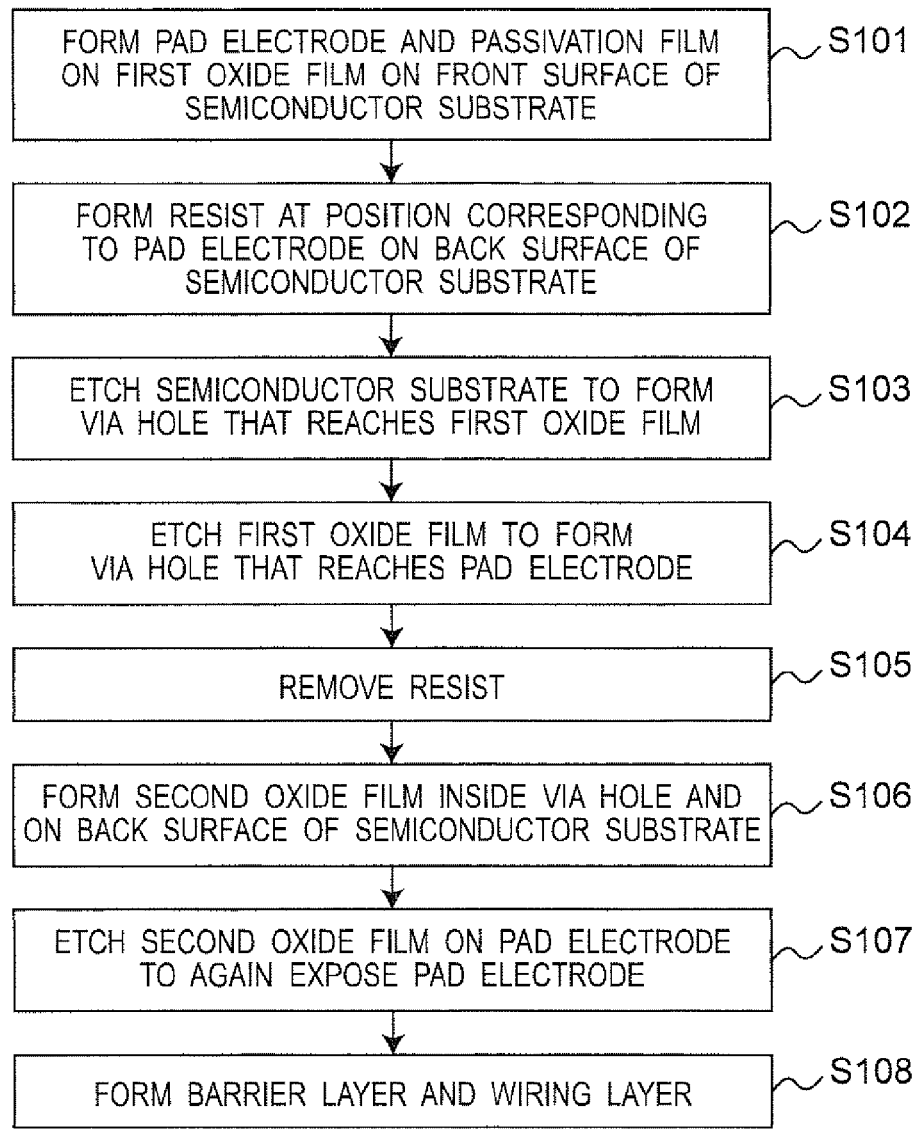
FIG. 18 is a flowchart showing a manufacturing method of the conventional semiconductor device.
Figure 19:
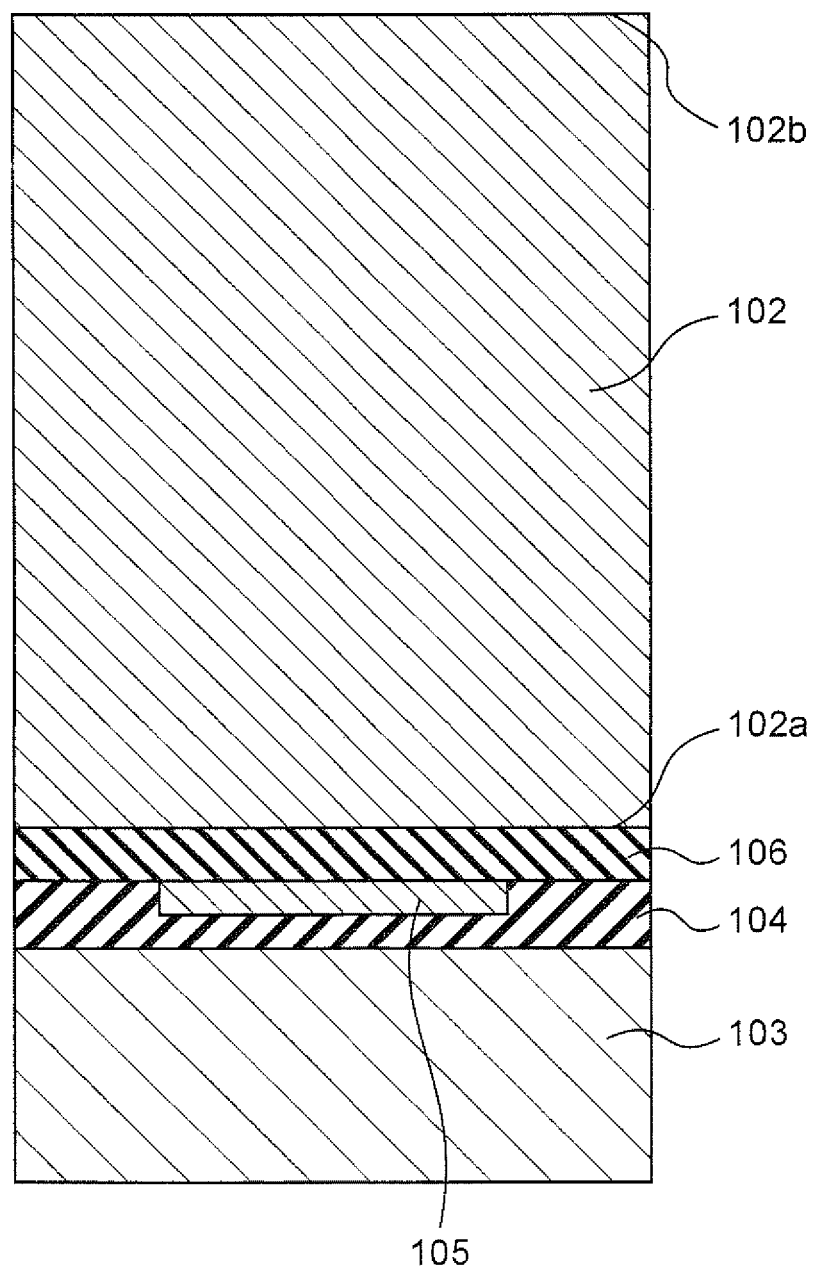
FIG. 19 is a view showing the conventional semiconductor device in a state after a supporting substrate is attached thereto.
Figure 20:
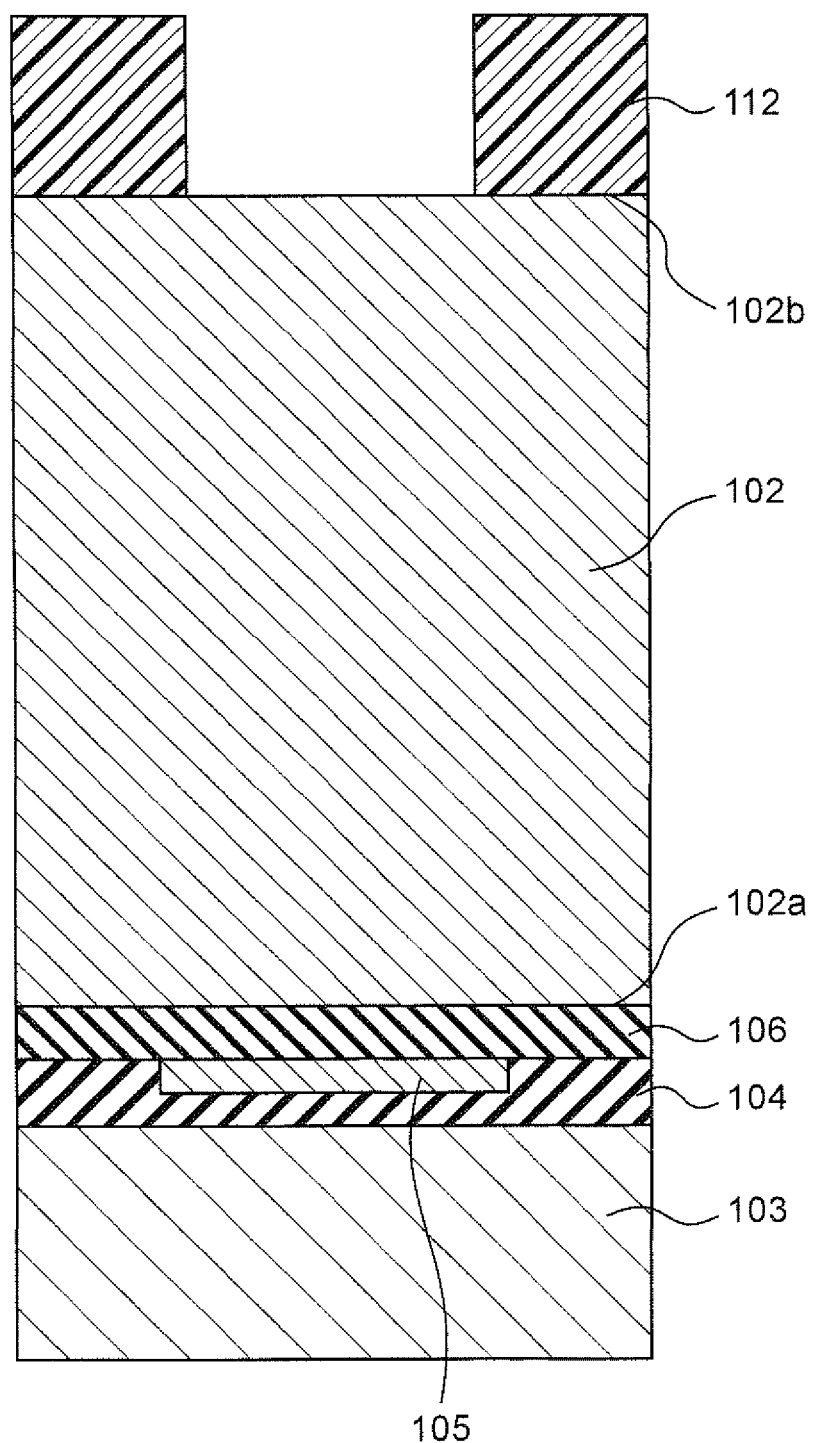
FIG. 20 is a view showing the conventional semiconductor device in a state after a resist is formed.
Figure 21:
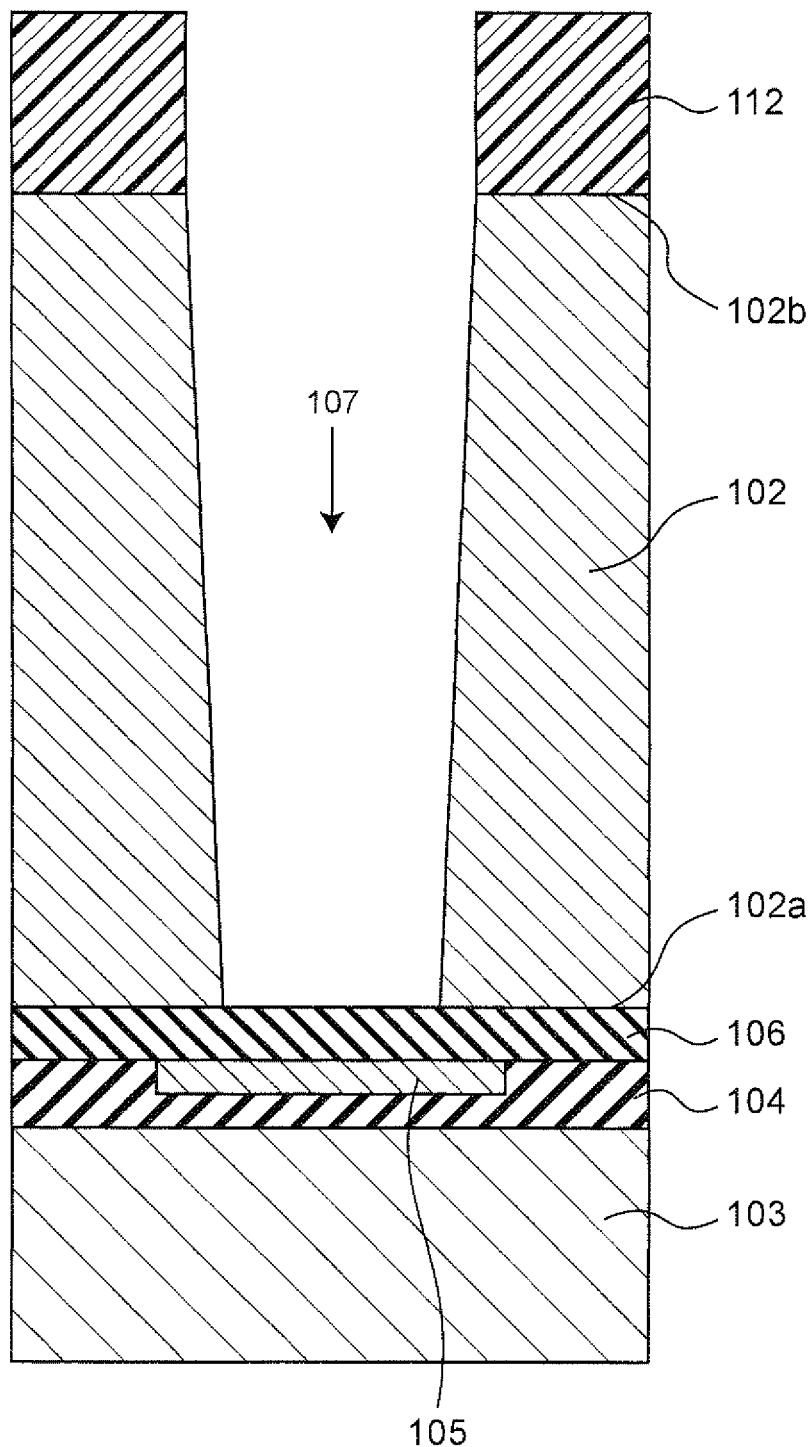
FIG. 21 is a view showing the conventional semiconductor device in a state after etching is carried out to a semiconductor substrate.
Figure 22:
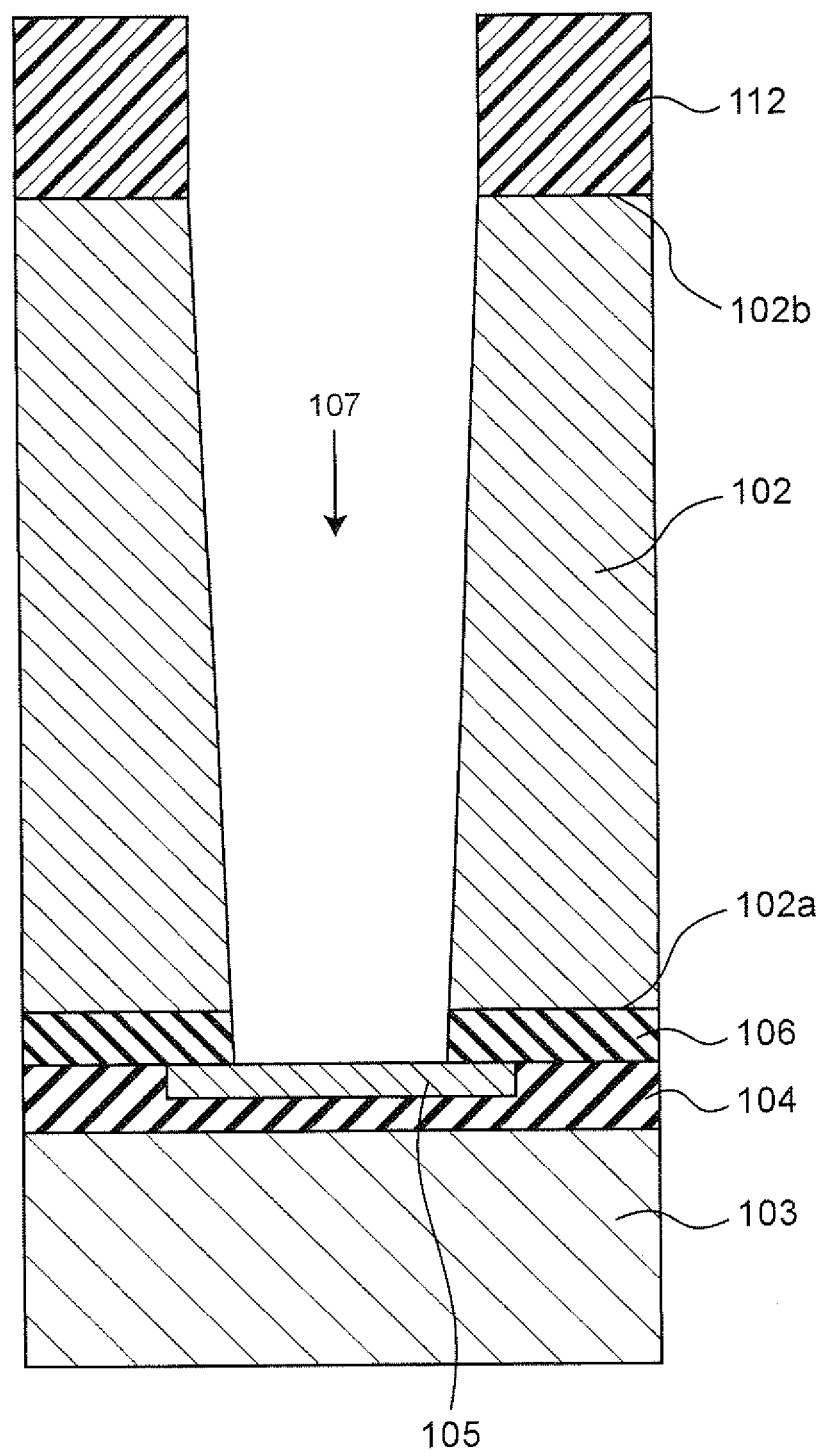
FIG. 22 is a view showing the conventional semiconductor device in a state after etching is carried out to a first oxide film.
Figure 23:
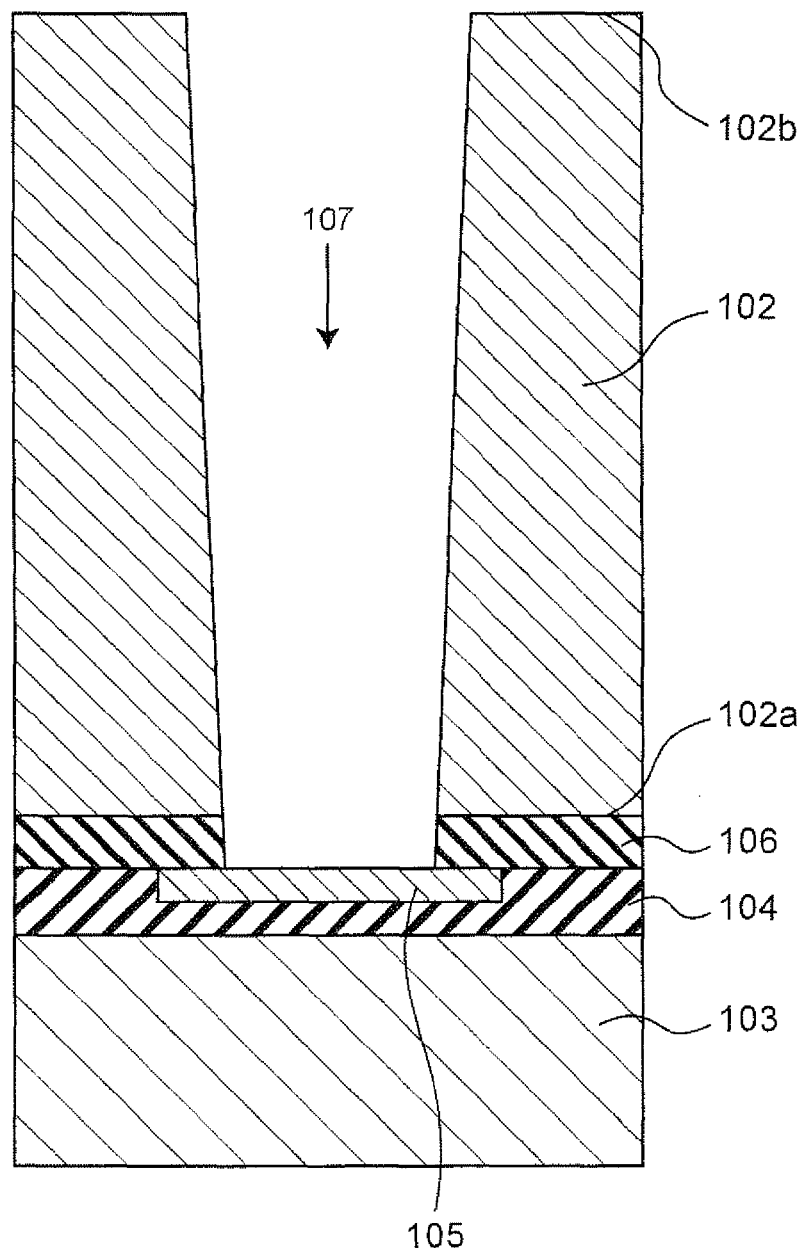
FIG. 23 is a view showing the conventional semiconductor device in a state after the resist is removed.
Figure 24:
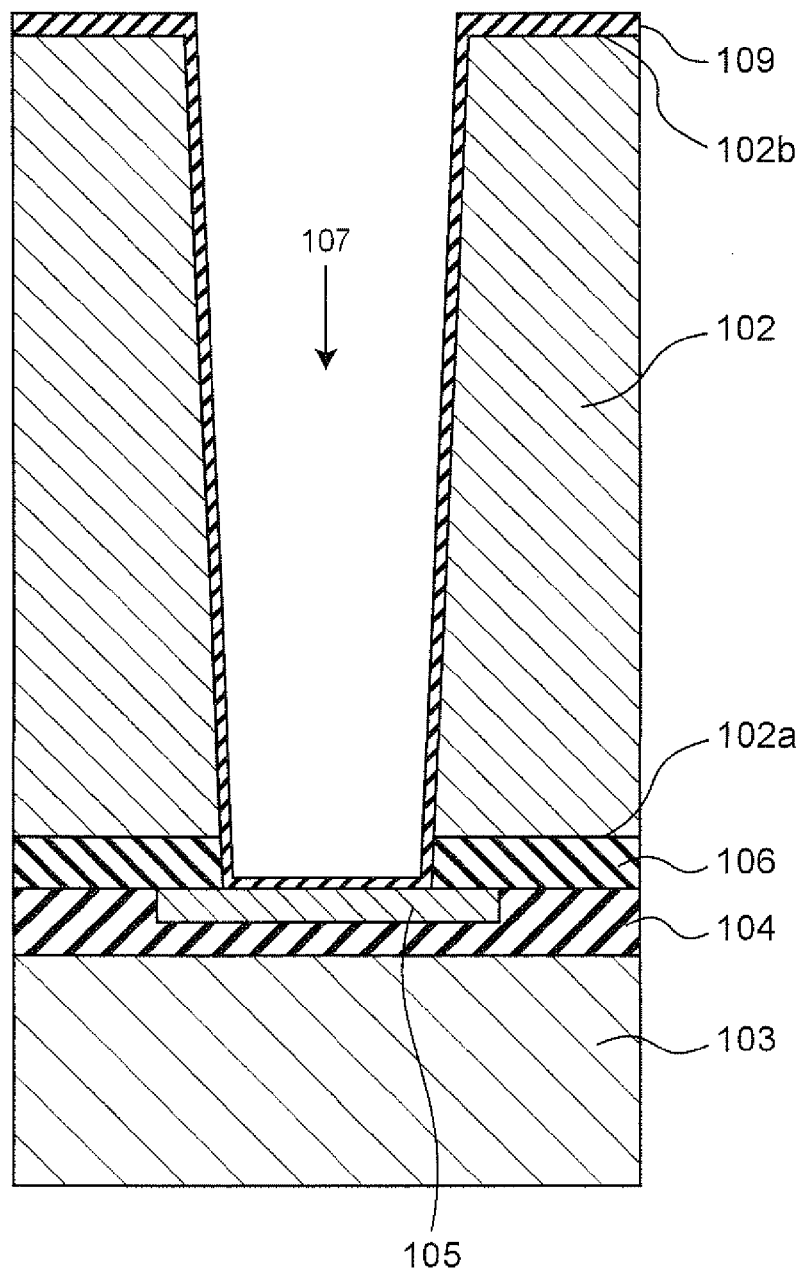
FIG. 24 is a view showing the conventional semiconductor device in a state after a second oxide film is formed.
Figure 25:
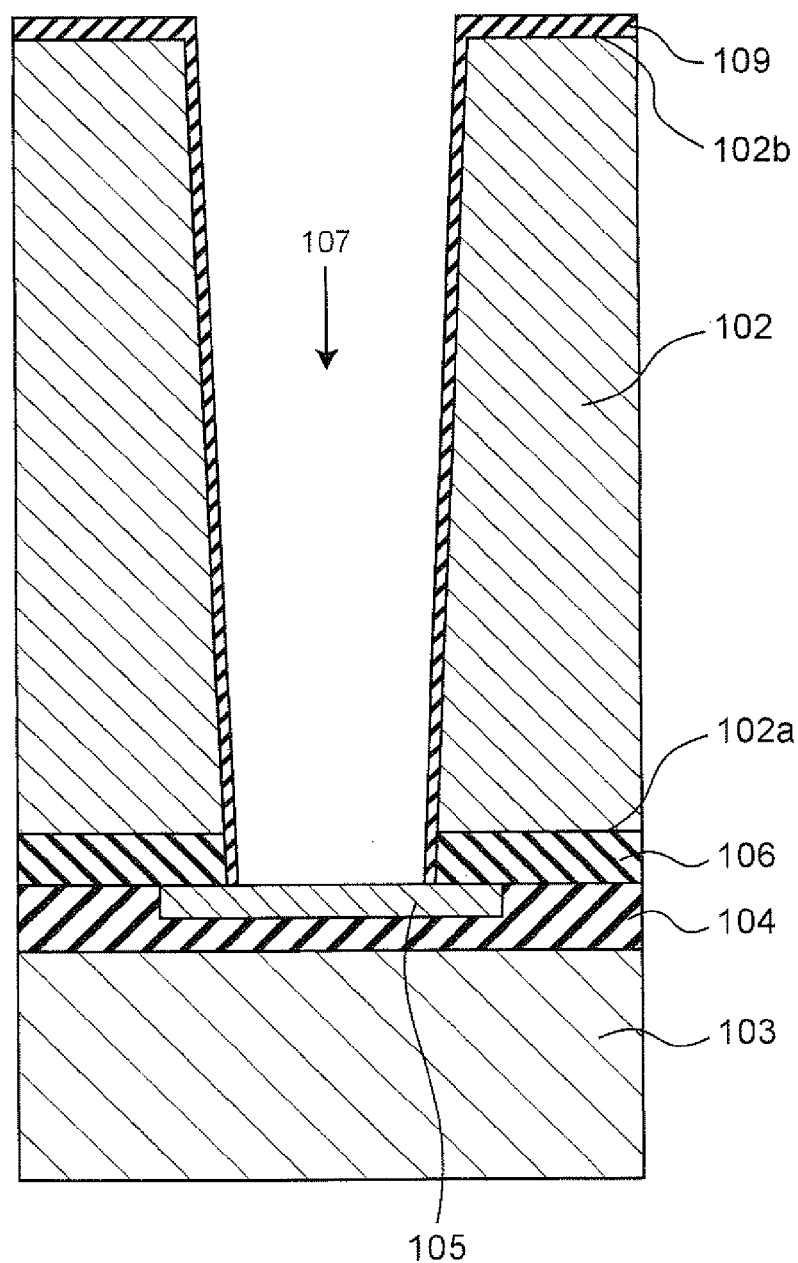
FIG. 25 is a view showing the conventional semiconductor device in a state after etching is carried out to the second oxide film.
Figure 26:
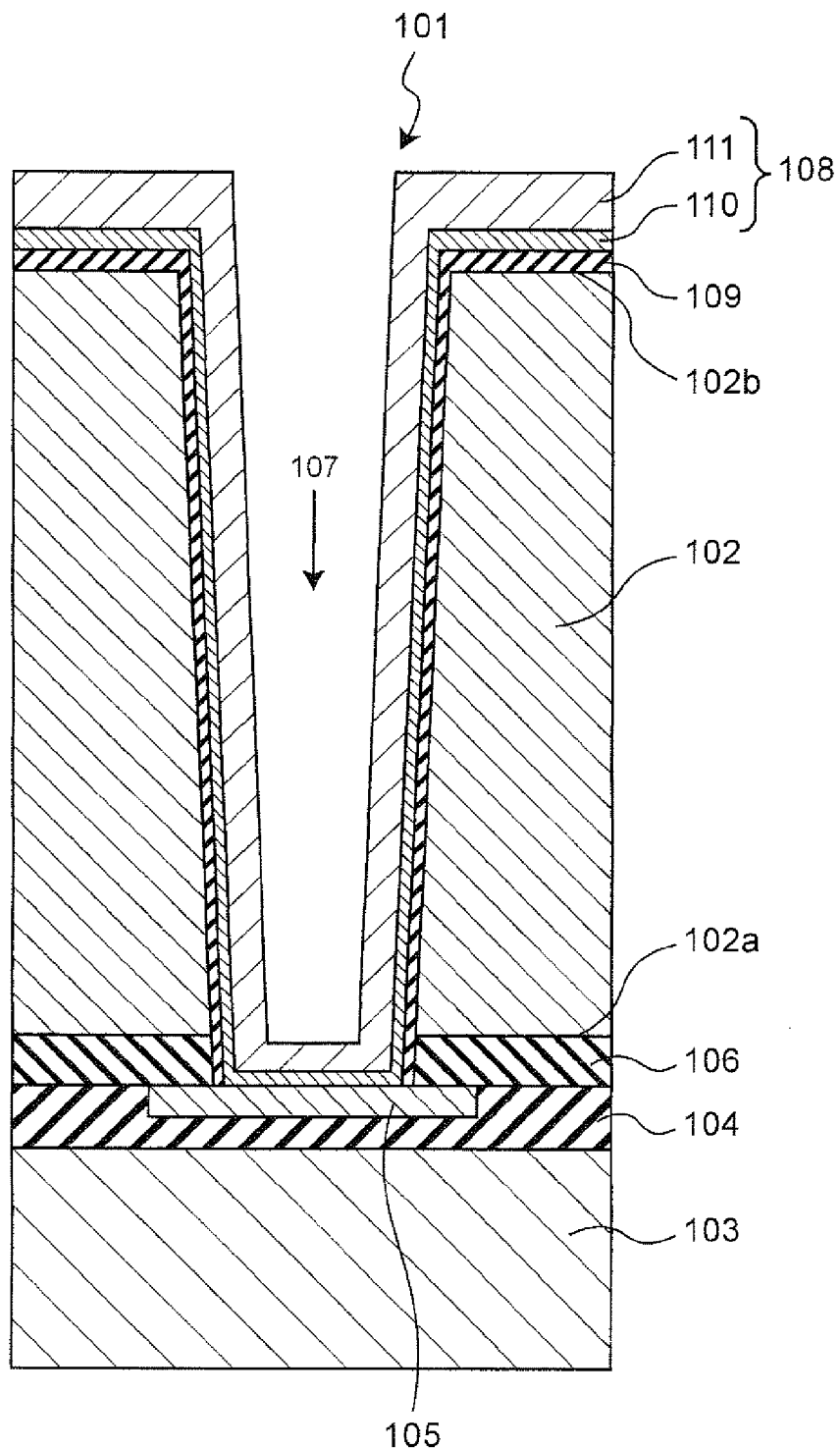
FIG. 26 is a view showing the conventional semiconductor device in a state after a barrier layer and a rewiring layer are formed.

As to the pad electrode 5 and the contact electrode 6, any materials which exhibit low resistance between the pad electrode 5 and the contact electrode 6 will suffice. For example, there is used as the pad electrode 5, aluminum, copper or an alloy thereof, titanium, titanium nitride, tantalum, tantalum nitride, a high melting point metal, or a compound thereof, or the like is used. Used as the contact electrode 6 is tungsten, aluminum or an alloy thereof, copper, or the like. It is to be noted that, the contact electrode 6 may be of a single contact form, or may be of a form structured with a plurality of contacts as shown in FIGS. 15 and 16. The diameter of the contact electrode 6 may be as great as or greater than the diameter of the pad electrode 5.

There is used as the first barrier layer 7, for the purpose of enhancing adhesion of the second oxide film 9 and the contact electrode 6, titanium, titanium nitride, titanium tungsten, tantalum, tantalumnitride, a high melting point metal, or a lamination film made up thereof, or the like.

As the silicide portion 10, which is formed on the front surface 2a of the semiconductor substrate 2, for the purpose of reducing the resistance, there is used tungsten silicide, titanium silicide, cobalt silicide, nickel silicide, or the like.

Used as the second barrier layer 14 is, for the purpose of enhancing adhesion of the silicide portion 10 and the rewiring layer 15, titanium, titanium nitride, titanium tungsten, tantalum, tantalumnitride, a high melting point metal, or a lamination film made up thereof, or the like.

As the rewiring layer 15, Cu or the like is used.

As the first oxide film 8 and the second oxide film 9, there is used $SiO_2$, an oxynitride film, a nitride film, or the like.

The material for the supporting substrate 3 is silicon glass. The supporting substrate 3 is attached to the passivation film 4, through an adhesive or by joining. As each of the passivation film 4 and the third oxide film 13, there is used $SiO_2$, an oxynitride film, a nitride film, an organic film made of polyimide or the like.

In a cross section taken along a plane including the center axis of the via hole 11, a diameter A of the silicide portion 10 is adjusted such that the following relationship of (Expression 1) is established between itself and a diameter B of the via hole 11. Then, the silicide portion 10 is formed with the diameter A of the silicide portion 10 adjusted in this manner. It is to be noted that, in a case where the silicide portion 10 and the via hole 11 are both in a circular shape, the comparison is based on their diameters; in a case where the silicide portion 10 and the via hole 11 are both in a quadrilateral shape, the comparison is based on their width dimensions.

$$A \leq B \qquad \text{(Expression 1)}$$

Here, the reason why the condition of the above-stated (Expression 1) is defined is to reduce variations in resistance value of the through-hole electrode layer 12. In the first embodiment, by satisfying the condition of the above-stated (Expression 1), the diameter A of the silicide portion 10 whose shape is uniquely determined makes it possible to define the resistance value of the through-hole electrode layer 12, and to reduce the variations in resistance value of the through-hole electrode layer 12. In contrast thereto, with the conventional structure in which the resistance value is defined by the diameter B of the via hole 11, the shape of the via hole 11 of the through-hole electrode obtained by etching may possibly vary. Hence, the variations in resistance value of the through-hole electrode may possibly occur.

It is to be noted that, for the purpose of allowing the third oxide film 13 and the second barrier layer 14 to closely adhere to each other, preferably, the thickness of the second barrier layer 14 on the bottom surface of the via hole 11 is uniform. Accordingly, in the first embodiment, the bottom surface of the via hole 11 is in a flat shape.

Figure 2:
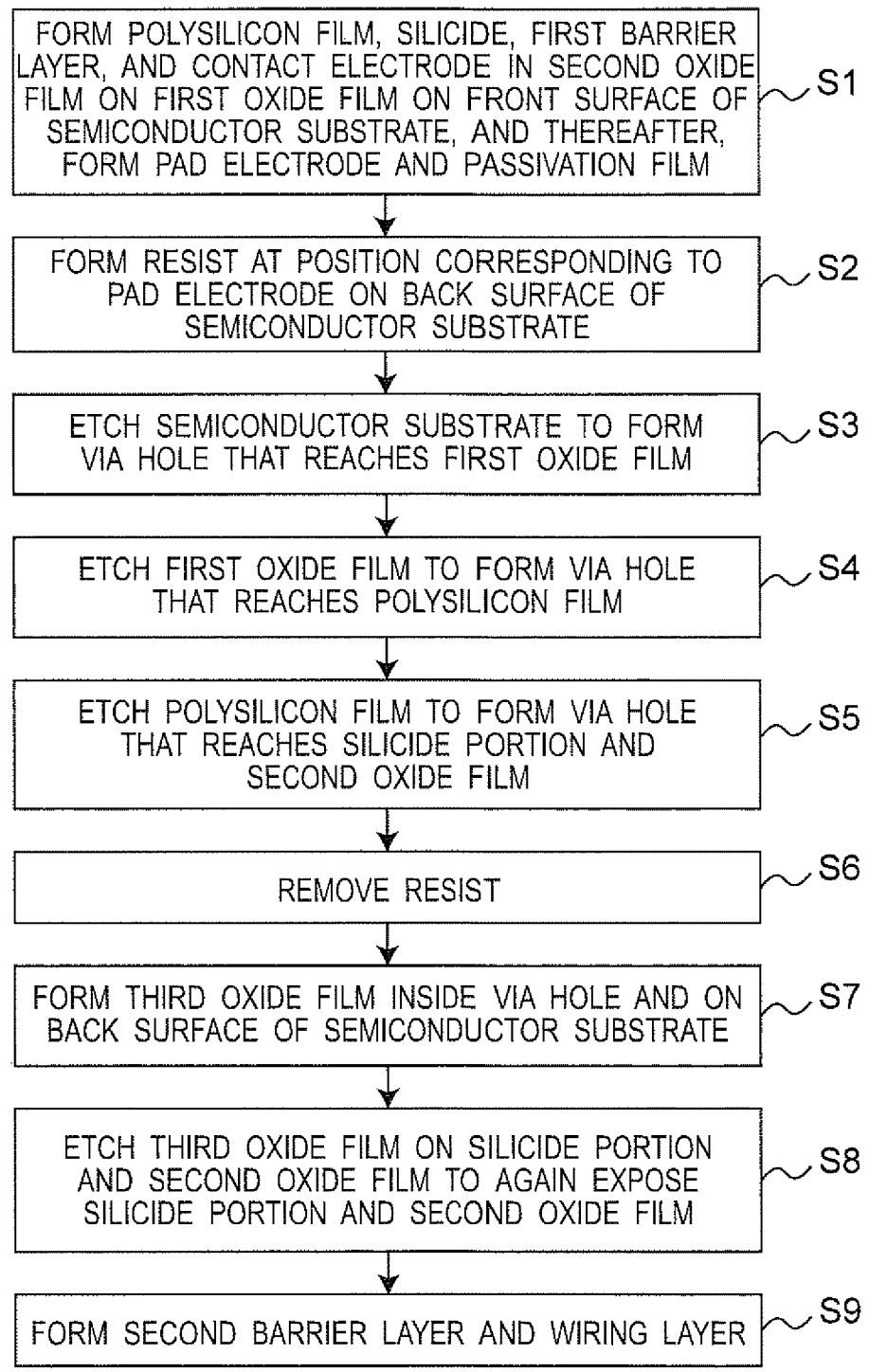
FIG. 2 is a flowchart showing a manufacturing method of the semiconductor device according to the first embodiment.

Next, with reference to the drawings, description will be given of a manufacturing method of the semiconductor device 1 described above. FIG. 2 is a flowchart showing the manufacturing method of the semiconductor device according to the first embodiment of the present invention. FIGS. 3 to 11 are each a cross-sectional view showing the manufacturing method of the semiconductor device according to the first embodiment of the present invention.

Figure 3:
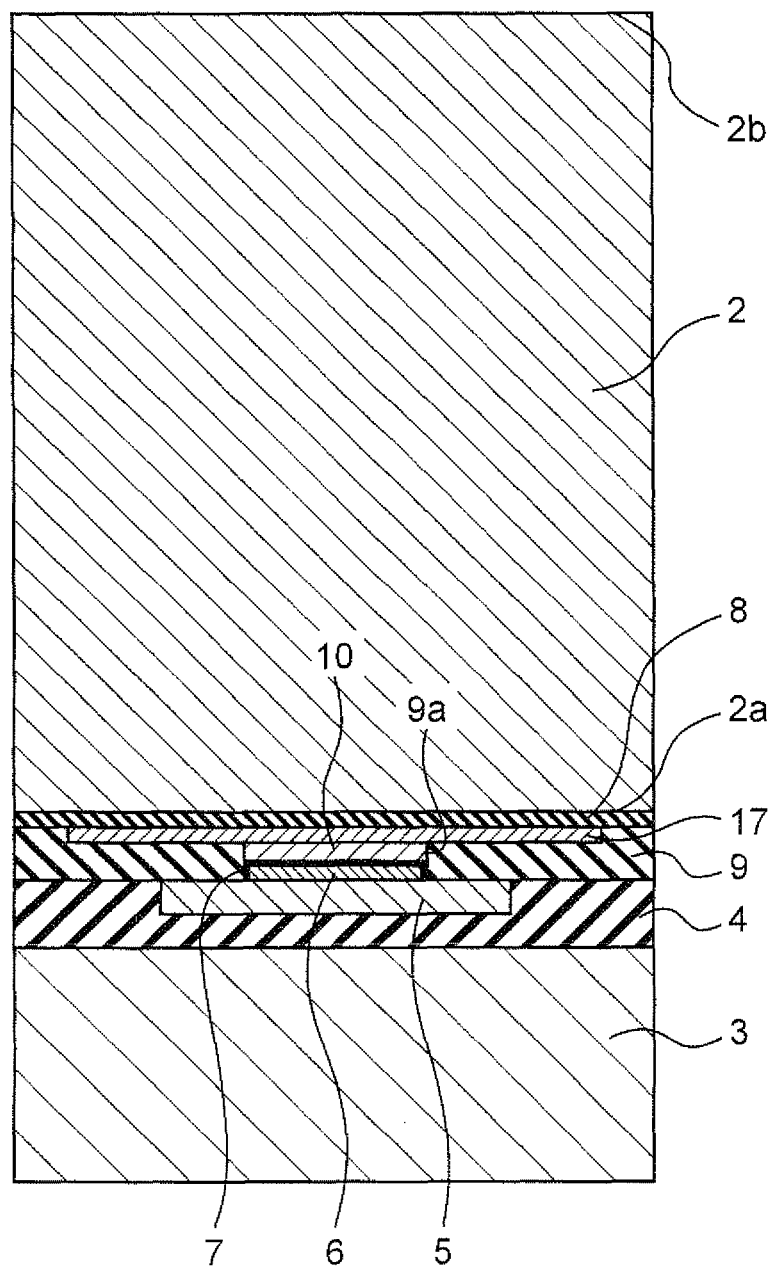
FIG. 3 is a view showing the semiconductor device according to the first embodiment in a state after a supporting substrate is attached thereto.

First, as shown in FIG. 3, on the front surface 2a of the semiconductor substrate 2 where a circuit (not shown) is formed, the first oxide film 8 is formed. Subsequently, on the first oxide film 8, the second oxide film 9 and a polysilicon film 17 are formed. Then, as shown in FIG. 3, on the polysilicon film 17 and in the circular hole 9a of the second oxide film 9, the silicide portion 10, the first barrier layer 7, and the contact electrode 6 are formed in order. Thereafter, the pad electrode 5 is formed on the second oxide film 9 and the contact electrode 6, and the passivation film 4 is formed on the second oxide film 9 and the pad electrode 5 (step S1 in FIG. 2). As a result, the silicide portion 10, the first barrier layer 7, and the contact electrode 6 are disposed in the circular hole 9a that is provided at the second oxide film 9.

The first oxide film 8 is thick enough to electrically insulate the semiconductor substrate 2 and the polysilicon film 17 from each other.

The pad electrode 5 is electrically connected to the polysilicon film 17 via the silicide portion 10, the first barrier layer 7, and the contact electrode 6. Further, because the semiconductor substrate 2 and the polysilicon film 17 are electrically insulated from each other, the pad electrode 5 is electrically insulated from the semiconductor substrate 2. Accordingly, using a measuring terminal or the like to probe the pad electrode 5, in a state before the via hole 11 is formed as shown in FIG. 3, using the electrode section (specifically, by establishing an electrical connection among the silicide portion 10, the first barrier layer 7, and the contact electrode 6 via the pad electrode 5), it becomes possible to measure the electrical characteristic of the circuit formed on the semiconductor substrate 2. This makes it possible to determine whether the circuit of the semiconductor substrate 2 is acceptable or defective, before the semiconductor device 1 is completed.

In a cross section taken along a plane including the center axis of the via hole 11, a diameter C of the polysilicon film 17 is set such that the following relationship of (Expression 2) is established between itself and the diameter A of the silicide portion 10. It is to be noted that, in a case where the polysilicon film 17 and the silicide portion 10 are both circular, the comparison is based on their diameters; in a case where the polysilicon film 17 and the silicide portion 10 are both quadrilateral, the comparison is based on their width dimensions.

$$C \geq A \quad \text{(Expression 2)}$$

Here, the reason why the condition of the above-stated (Expression 2) is defined is to further reduce the variations in resistance value of the through-hole electrode layer 12. In the first embodiment, by satisfying the condition of the above-stated (Expression 2), the diameter A of the silicide portion 10 whose shape is uniquely determined makes it possible to define the resistance value of the through-hole electrode layer 12, and to reduce the variations in resistance value of the through-hole electrode layer 12. In contrast thereto, with the conventional structure in which the resistance value is defined by the diameter C of the polysilicon film 17, the shape of the polysilicon film 17 may possibly vary. Hence, the variations in resistance value of the through-hole electrode may possibly occur.

As the silicide portion 10, a layer formed through a thermal reaction of the first barrier layer 7 is used. Alternatively, it is possible to use, as the silicide portion 10, a layer made of tungsten silicide, titanium silicide, cobalt silicide, nickel silicide, or the like, which is formed through a thermal reaction after another film (e.g., made of tungsten, titanium, cobalt, nickel, or the like) is deposited on the polysilicon film 17. In the case where the silicide portion 10 is formed on the polysilicon film 17 by allowing the first barrier layer 7 to thermally react, the diameter of the silicide portion 10 is equal to the hole diameter of the contact electrode 6.

Then, on the passivation film 4, the supporting substrate 3 is attached through an adhesive (not shown).

Figure 4:
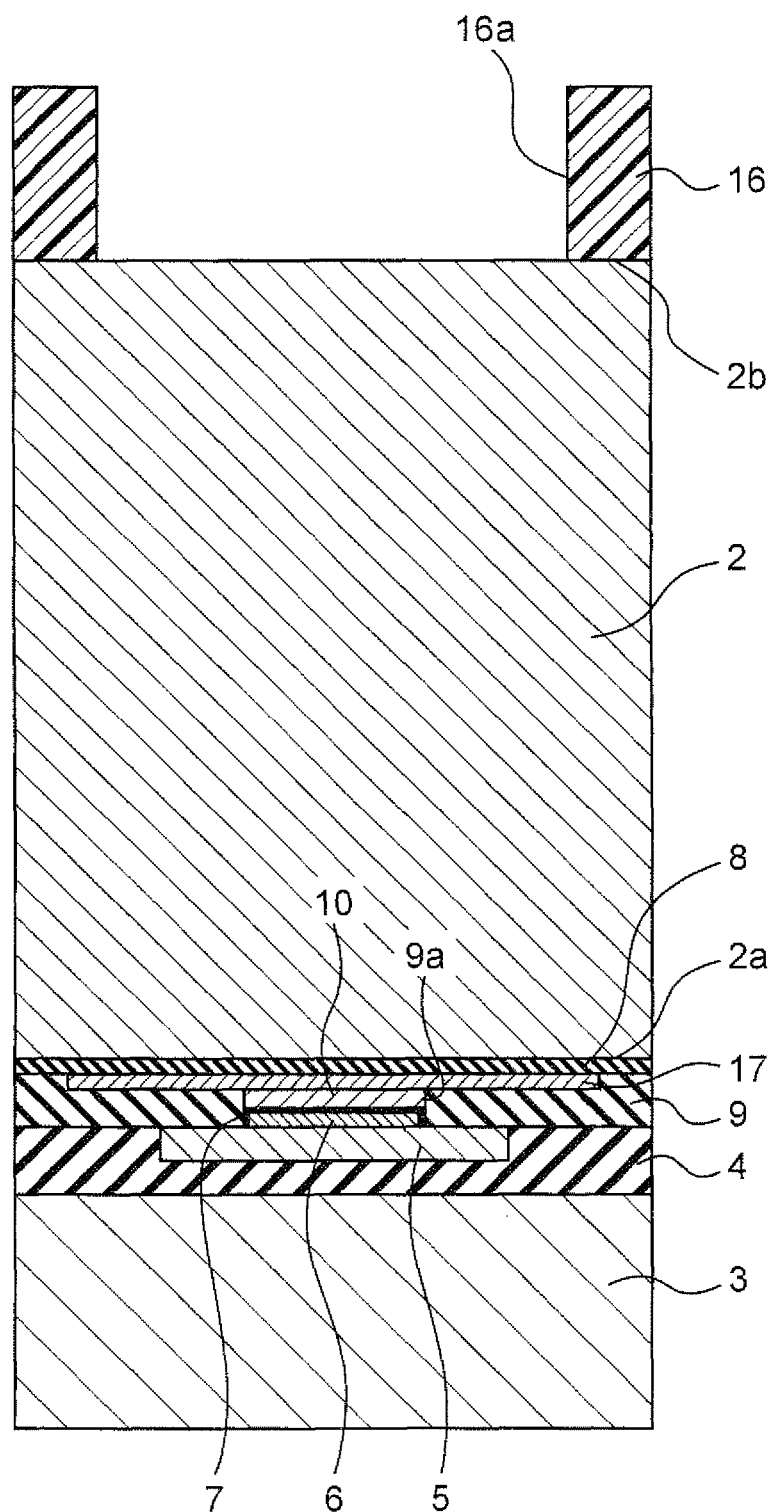
FIG. 4 is a view showing the semiconductor device according to the first embodiment in a state after a resist is formed thereon.

Next, as shown in FIG. 4, on the back surface 2b of the semiconductor substrate 2, a resist 16 having an opening portion 16a is formed for providing an opening at a position corresponding to the pad electrode 5 (step S2 in FIG. 2).

Figure 5:
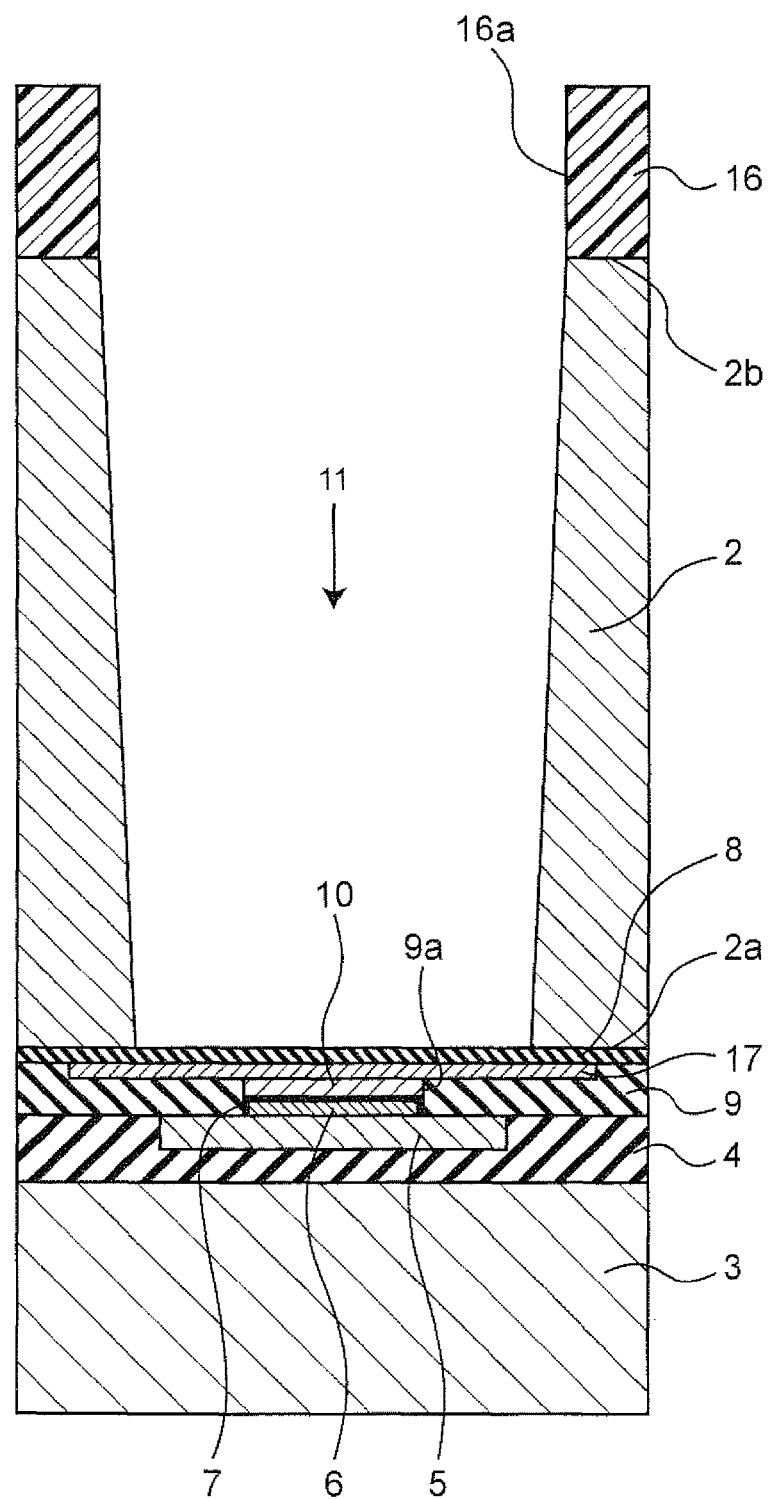
FIG. 5 is a view showing the semiconductor device according to the first embodiment in a state after etching is carried out to a semiconductor substrate.

Then, as shown in FIG. 5, by etching the semiconductor substrate 2 using the resist 16 as an etching-purpose mask, the via hole 11 reaching the first oxide film 8 is formed (step S3 in FIG. 2). The first oxide film 8 serves as an etching stopper layer for the semiconductor substrate 2, and the shape of the bottom surface of the via hole 11 becomes flat. The diameter B of the via hole 11 is adjusted such that the above-stated relationship of (Expression 1) is established between itself and the diameter A of the silicide portion 10. It is to be noted that, from the viewpoint of the adhesion of the second barrier layer 14, the diameter B of the via hole 11 is desirably equal to or less than the diameter C of the polysilicon film 17. However, so long as it falls within the range in which the above-stated relationship of (Expression 2) is satisfied, the diameter B of the via hole 11 may be greater than the diameter C of the polysilicon film 17.

Figure 6:
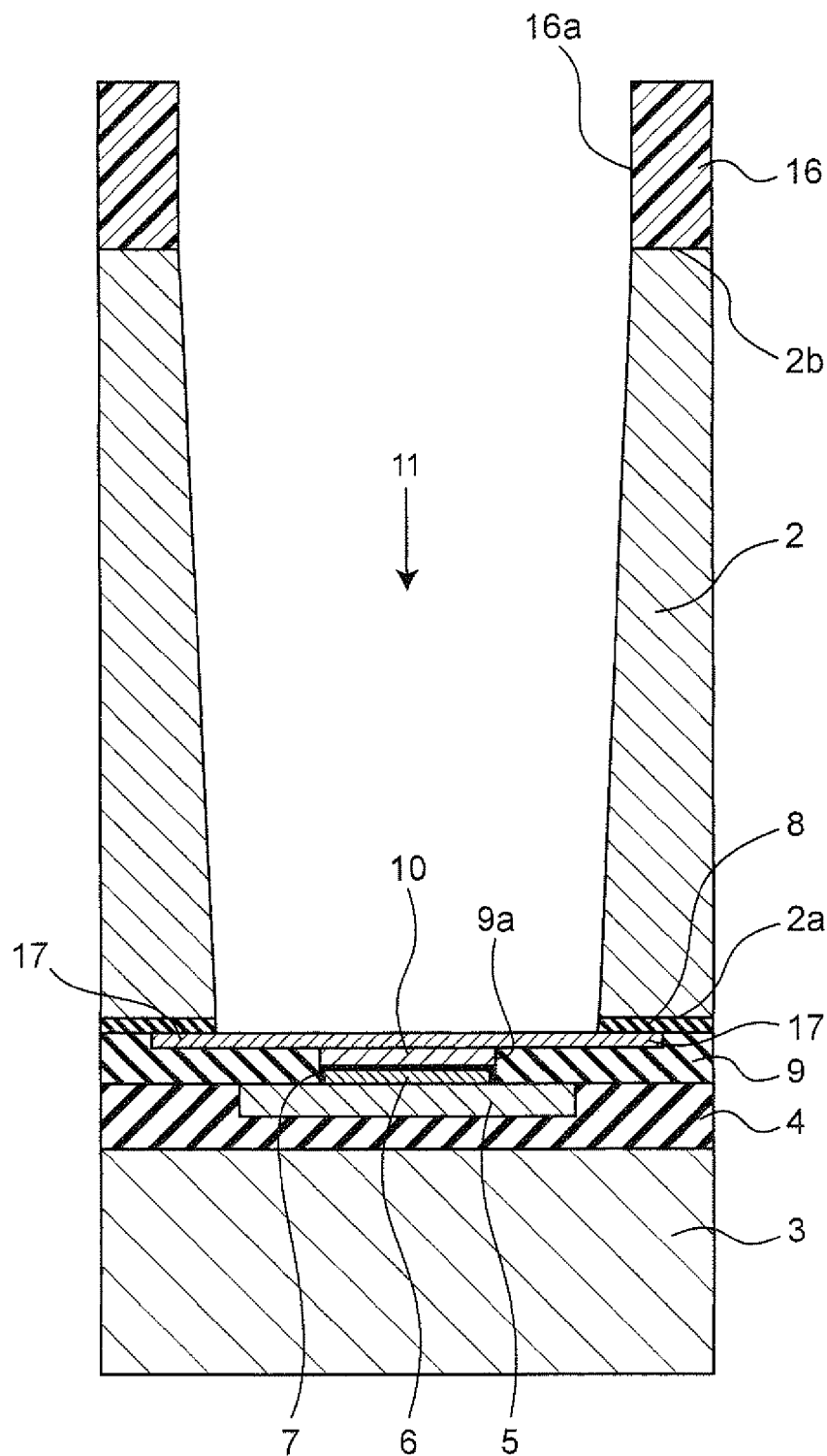
FIG. 6 is a view showing the semiconductor device according to the first embodiment in a state after etching is carried out to a first oxide film.

Next, as shown in FIG. 6, by etching the first oxide film 8, the via hole 11 reaching the polysilicon film 17 is formed (step S4 in FIG. 2). The polysilicon film 17 serves as an etching stopper layer of the first oxide film 8, and the shape of the bottom surface of the via hole 11 becomes flat.

Figure 7:
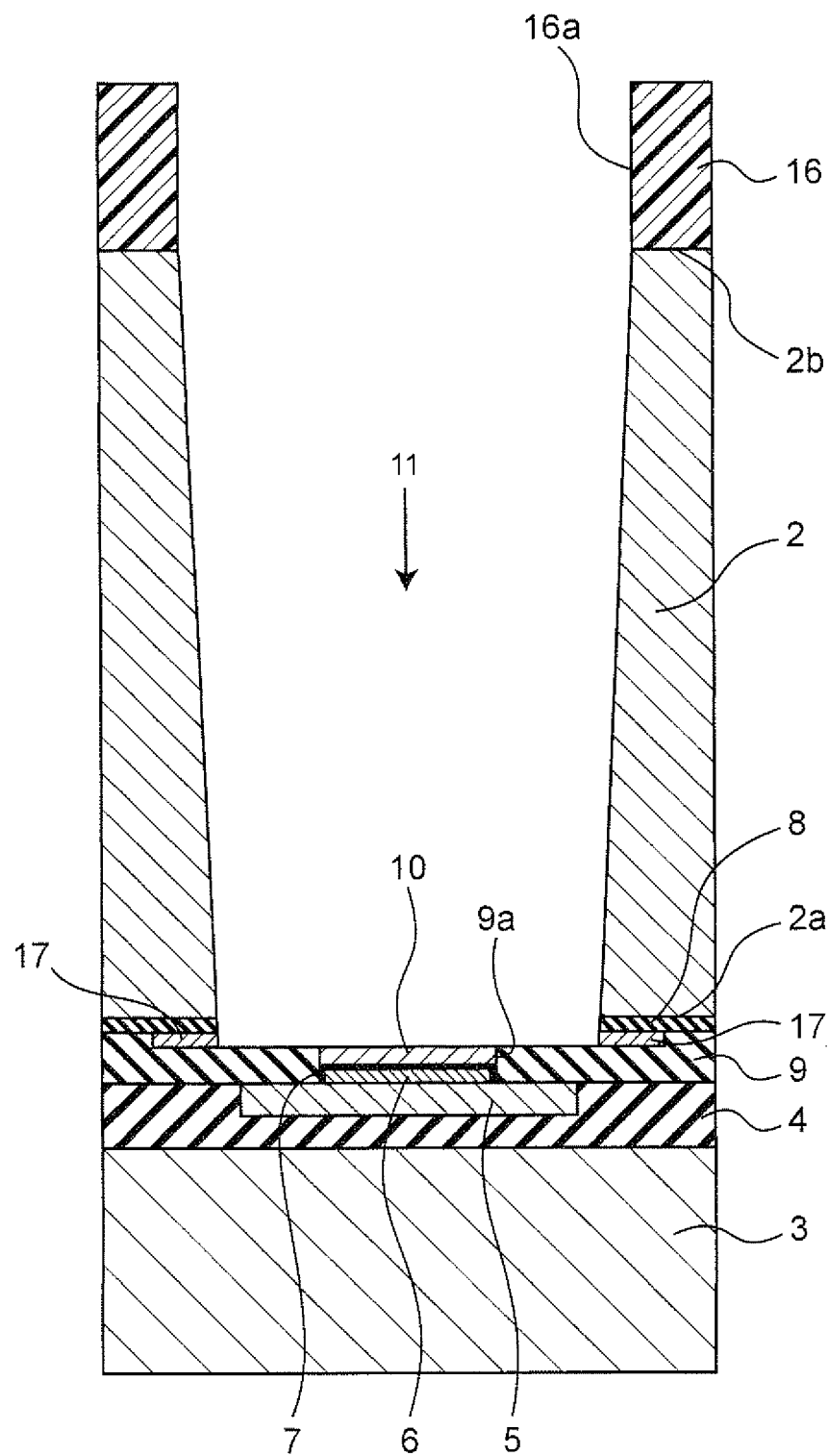
FIG. 7 is a view showing the semiconductor device according to the first embodiment in a state after etching is carried out to a polysilicon film.

Subsequently, as shown in FIG. 7, by etching the polysilicon film 17, the via hole 11 reaching the silicide portion 10 and the second oxide film 9 is formed (step S5 in FIG. 2). The silicide portion 10 and the second oxide film 9 each serve as an etching stopper layer for the polysilicon film 17, and the shape of the bottom surface of the via hole 11 becomes flat. The etching of the polysilicon film 17 is desirably carried out by dry etching.

It is to be noted that, in a case where the polysilicon film 17 is used as part of the through-hole electrode layer 12, the etching of the polysilicon film 17 is not necessary. Desirably, the polysilicon film 17 in this case has its resistance reduced by doping. While n-type doping is desirable, it may be of the p-type. However, in a case where the polysilicon film 17 is used as part of the electrode as it is, the polysilicon film 17 may not be etched. In that case, it is desirable that the polysilicon film 17 is doped.

Figure 8:
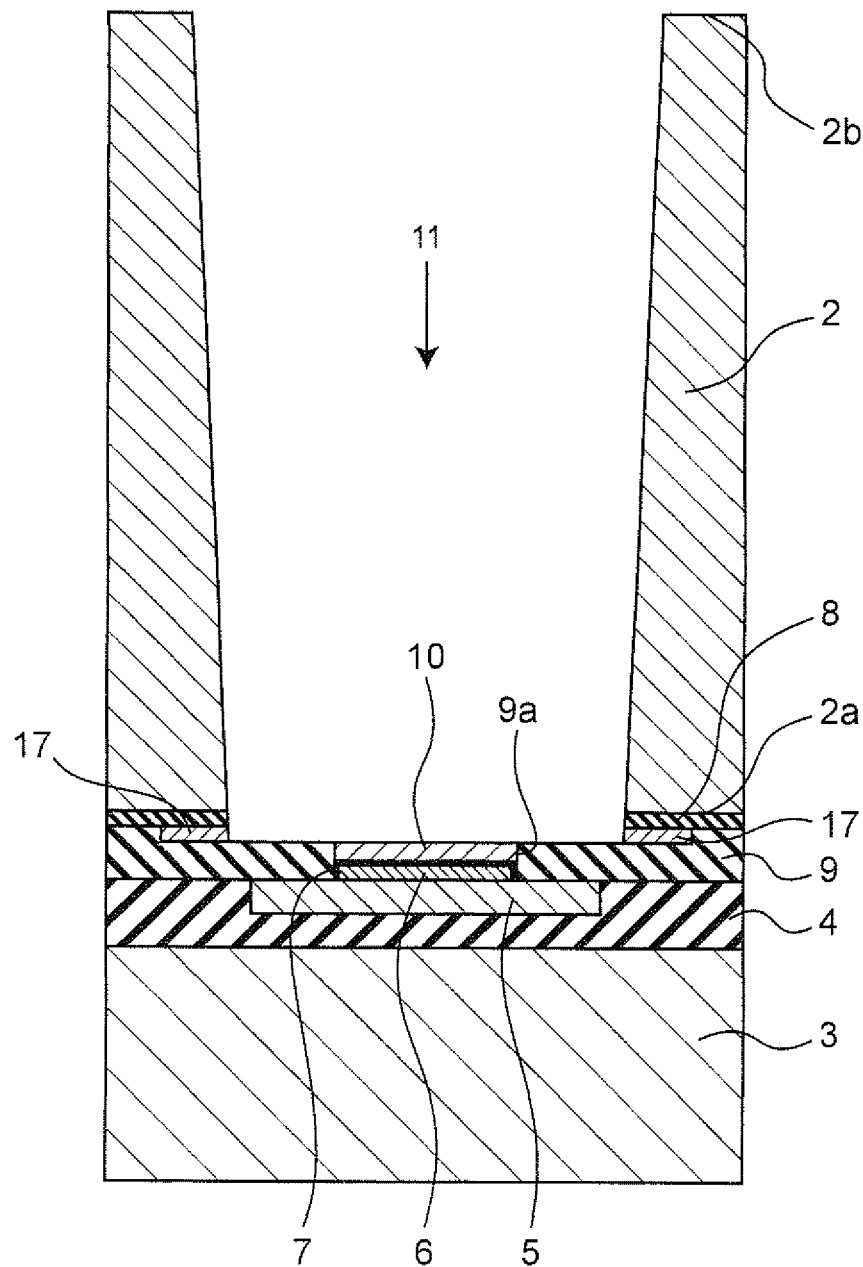
FIG. 8 is a view showing the semiconductor device according to the first embodiment in a state after the resist is removed therefrom.

Next, as shown in FIG. 8, the resist 16 is removed from the back surface 2b of the semiconductor substrate 2 (step S6 in FIG. 2). For carrying out the removal of the resist 16, wet processing or dry processing is used.

Figure 9:
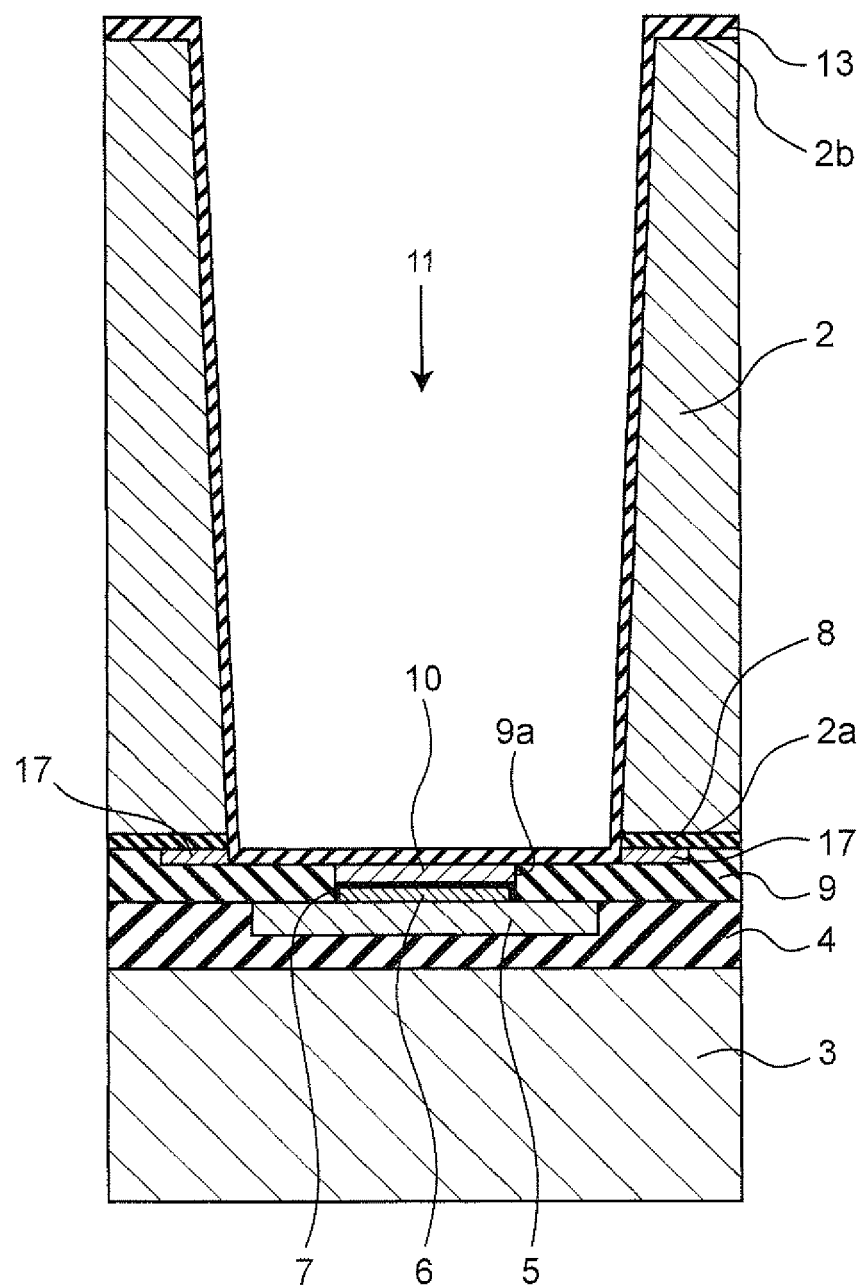
FIG. 9 is a view showing the semiconductor device according to the first embodiment in a state after a third oxide film is formed.

Then, as shown in FIG. 9, inside the via hole 11 (i.e., on the sidewall and on the bottom surface) and on the back surface 2b of the semiconductor substrate 2, the third oxide film 13 is formed (step S7 in FIG. 2). In forming the third oxide film 13, thermal oxidation, CVD, or sputtering is used.

Figure 10:
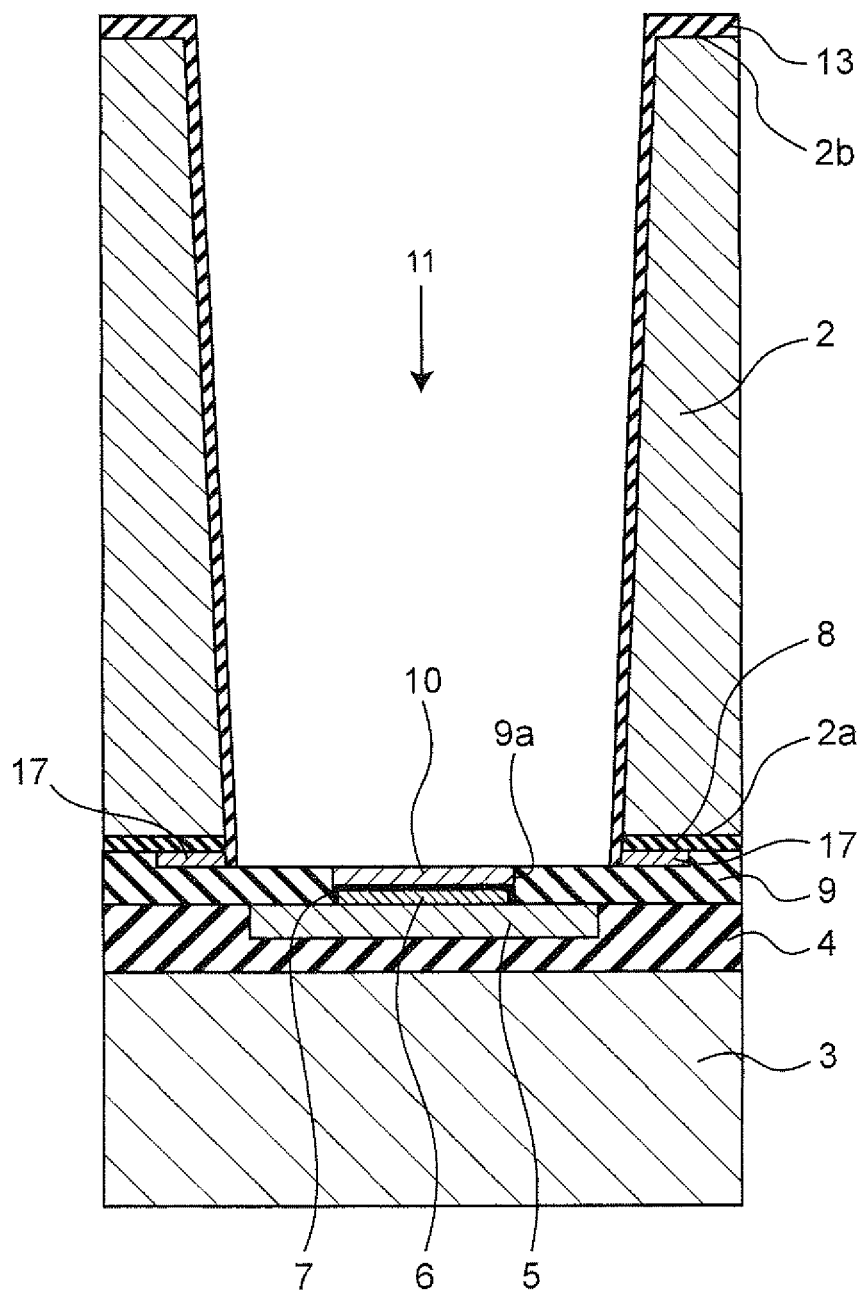
FIG. 10 is a view showing the semiconductor device according to the first embodiment in a state after etching is carried out to the third oxide film.

Next, as shown in FIG. 10, by etching the third oxide film 13 positioned on the bottom surface of the via hole 11, that is, the third oxide film 13 positioned on the silicide portion 10 and the second oxide film 9, so as to remove the same, the silicide portion 10 and the second oxide film 9 are exposed again (step S8 in FIG. 2). By etching the third oxide film 13 by a thickness of the third oxide film 13 on the silicide portion 10 and on the second oxide film 9, the shape of the bottom surface of the via hole 11 is kept flat. The etching of the third oxide film 13 is desirably carried out by dry etching. The third oxide film 13 on the sidewall of the via hole 11 and on the back surface 2b of the semiconductor substrate 2 just slightly reduces in thickness and remains mostly.

Figure 11:
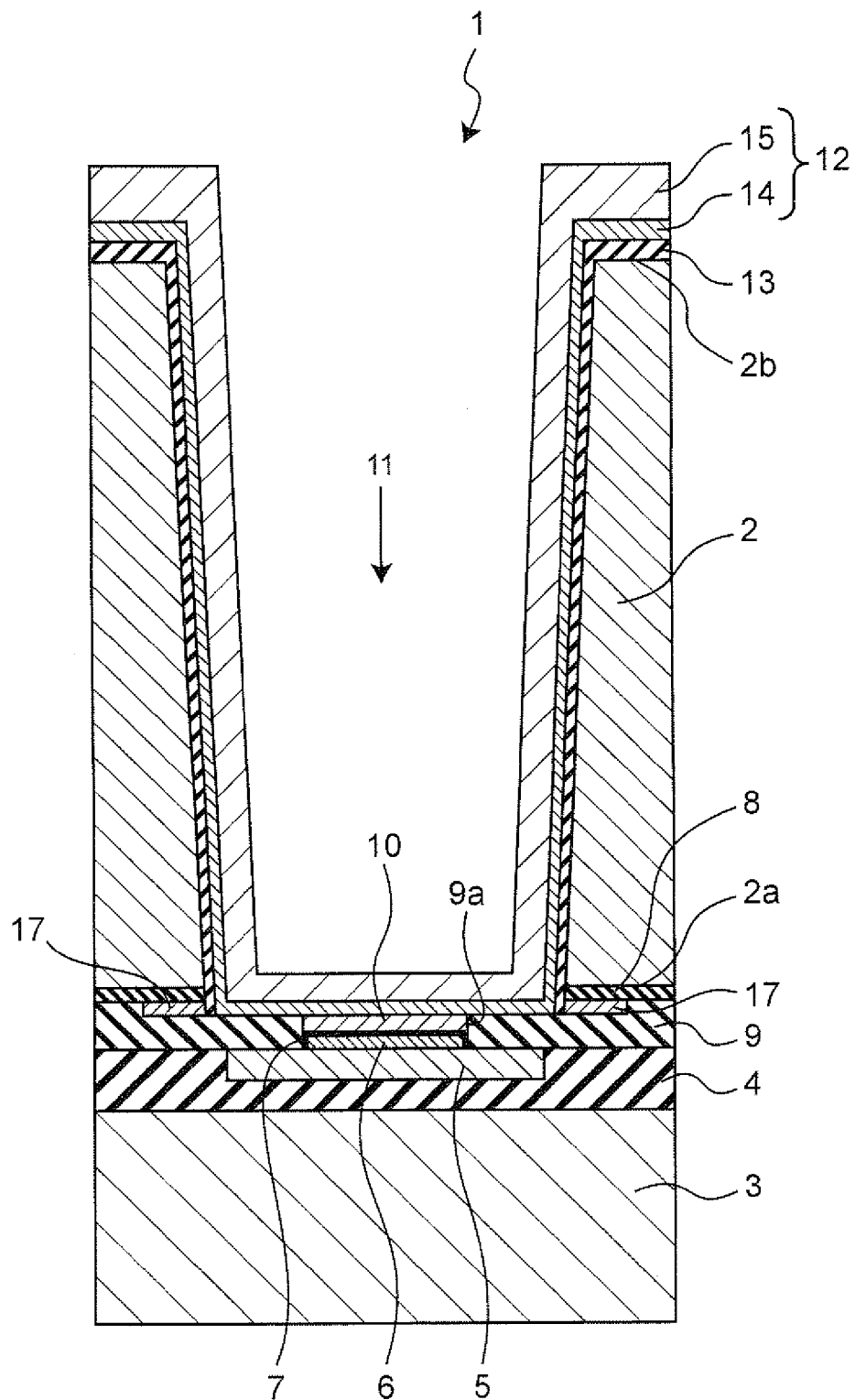
FIG. 11 is a view showing the semiconductor device according to the first embodiment in a state after a second barrier layer and a rewiring layer are formed.

Subsequently, as shown in FIG. 11, the second barrier layer 14 and the rewiring layer 15 are formed on the third oxide film 13 (step S9 in FIG. 2). In forming the second barrier layer 14, CVD or sputtering is used. Because the shape of the bottom surface of the via hole 11 is flat, the thickness of the second barrier layer 14 on the bottom surface of the via hole 11 becomes uniform, and the second barrier layer 14 which exhibits excellent adhesion to the third oxide film 13 is formed. Further, the second barrier layer 14 on the bottom surface of the via hole 11 suppresses diffusion of the material structuring the rewiring layer 15 (e.g., Cu) into the semiconductor substrate 2. In the case where the thickness of the second barrier layer 14 is uniform, the second barrier layer 14 can be thinned. Desirably, the rewiring layer 15 is formed by plating, while the rewiring layer 15 may be formed by CVD, sputtering, or any combination thereof. The rewiring layer 15 is shaped such that the via hole 11 is buried incompletely (i.e., partially) or buried completely (i.e., entirely).

With the structure of the first embodiment, the resistance value between the pad electrode 5 and the through-hole electrode layer 12 is dependent on the diameter of the silicide portion 10, and not on the diameter of the via hole 11. Accordingly, the resistance value between the pad electrode 5 and the through-hole electrode layer 12 will not be affected by the variations in diameter of the via hole 11. The via hole 11 and the silicide portion 10 are different in processing accuracy. The processing variation in diameter of the via hole 11 is approximately 1 µm, whereas the processing variation in diameter of the silicide portion 10 is approximately 1 nm. Accordingly, with the semiconductor device 1 and the manufacturing method thereof according to the first embodiment, the variations in resistance value between the pad electrode 5 and the through-hole electrode layer 12 can be reduced as compared to the conventional manner.

Further, with the semiconductor device 1 and the manufacturing method thereof according to the first embodiment, the diameter of the via hole 11 can be set to be greater than the diameter of the pad electrode 5. Therefore, the aspect ratio of the via hole 11 can be reduced, thereby to reduce the manufacturing cost. Furthermore, a reduction in size of the pad electrode 5 makes it possible to reduce the area of the semiconductor chip.

Still further, with the semiconductor device 1 and the manufacturing method thereof according to the first embodiment, the shape of the bottom surface of the via hole 11 becomes flat. This allows the thickness of the second barrier layer 14 on the bottom surface of the via hole 11 to be uniform. Because the thickness of the second barrier layer 14 on the bottom surface of the via hole 11 becomes uniform, the second barrier layer 14 exhibiting excellent adhesion to the third oxide film 13 can be formed.

It is to be noted that, the same effect can be achieved using an amorphous silicon film in place of the polysilicon film 17 according to the first embodiment.

Here, with reference to FIGS. 15 and 16, description will be given of a case where the contact electrode 6 is structured with a plurality of contact members.

FIG. 15 is a cross-sectional view of a semiconductor device of a first example according to the first embodiment, in which the contact electrode 6 is structured with a plurality of disc-like or quadrilateral plate-like contact members 6b in the second oxide film 9. In the semiconductor device shown in FIG. 15, before the contact electrodes 6b are formed, one silicide portion 10 is formed in one hole 9d at the second oxide film 9. Thereafter, the plurality of disc-like or quadrilateral plate-like contact members 6b are disposed in a plurality of small holes 9b at the second oxide film 9. It is to be noted that, at this time, the plurality of disc-like or quadrilateral plate-like contact members 6b are disposed so as to each contact the silicide portion 10.

Further, FIG. 16 is a cross-sectional view of a semiconductor device of a second example according to the first embodiment, in which the contact electrode 6 is structured with a plurality of disc-like or quadrilateral plate-like contact members 6c in the second oxide film 9. In the semiconductor device shown in FIG. 16, the contact electrodes 6c are respectively formed in a plurality of holes 9c at the second oxide film 9. Thereafter, silicide portions 10c are formed in the holes 9c, respectively. It is to be noted that, at this time, the silicide portions 10c are formed so as to contact the contact electrodes 6c in the plurality of holes 9c, respectively.

With the semiconductor devices having the structure shown in FIGS. 15 and 16 also, the resistance value between the pad electrode 5 and the through-hole electrode layer 12 is independent of the variations in diameter of the via hole 11. Accordingly, the semiconductor device having the structure shown in FIGS. 15 and 16 is also highly reliable with small variations in resistance value.

First Modified Example of the First Embodiment

Figure 12:
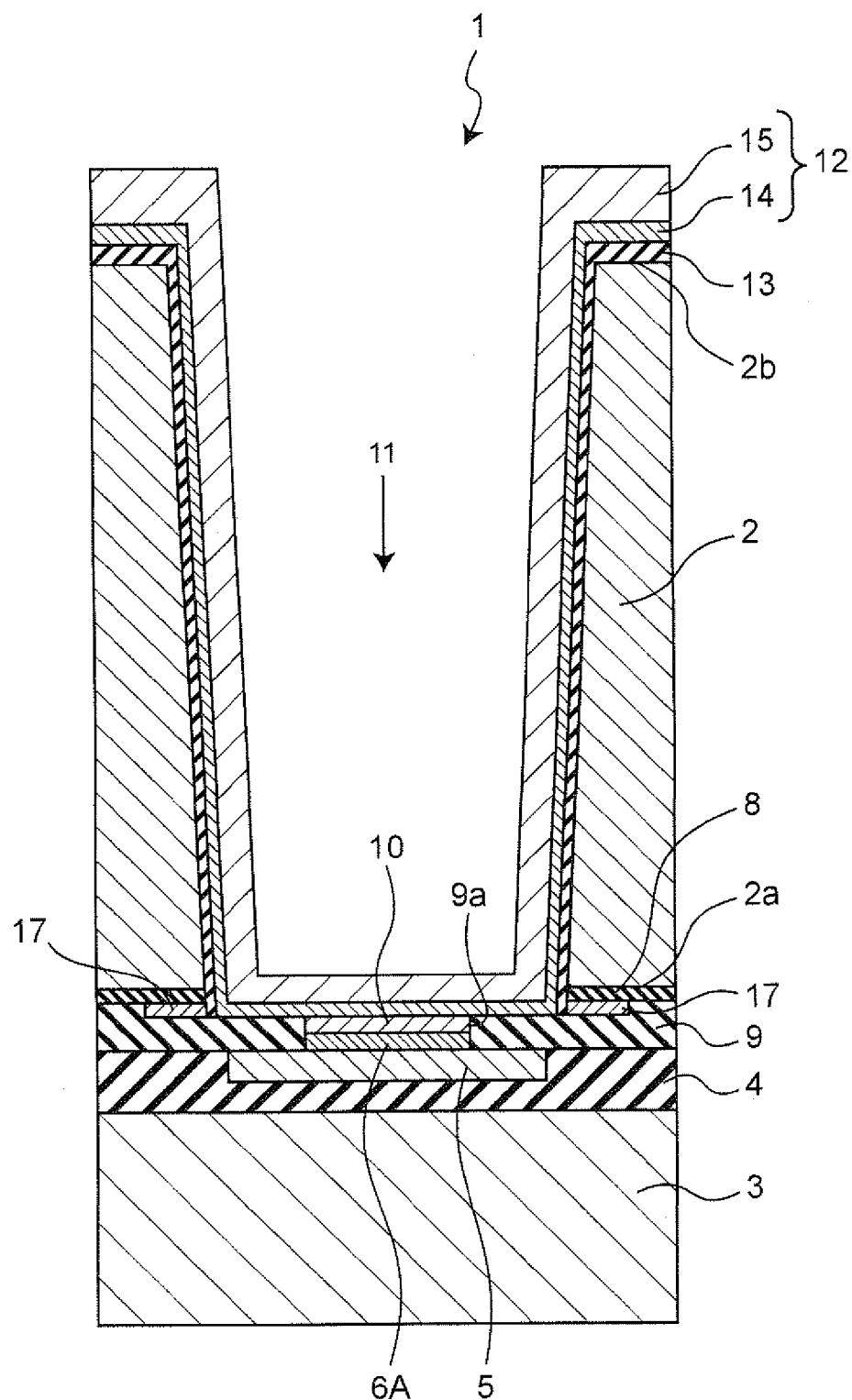
FIG. 12 is a cross-sectional view of a semiconductor device of a first variation according to the first embodiment.

In the first embodiment, the first barrier layer 7 and the contact electrode 6 are separately formed. However, the present invention is not limited thereto. Instead, as a first modified example of the first embodiment, as shown in FIG. 12, the first barrier layer 7 and the contact electrode 6 may integrally be formed as a contact electrode 6A. That is, the first barrier layer 7 may be thinned or may be omitted. In giving description of the first modified example, a laminated film in which a TiN layer and a Ti layer are laminated is used as one example of the first barrier layer 7.

The Ti layer of the first barrier layer 7 has a function of forming an ohmic contact with the polysilicon film 17, and a function of improving adhesion of the second oxide film 9 to the TiN layer of the first barrier layer 7. In connection with the function of forming the ohmic contact, for example, by forming the silicide portion 10 of $TiSi_2$ by a thermal reaction between Ti of the Ti layer and Si of the polysilicon film 17, the ohmic contact can be obtained. It is to be noted that, in a case where the silicide portion 10 is formed at a portion other than the first barrier layer 7, the Ti layer can be omitted.

Further, provided that any contact electrode material that does not diffuse into the polysilicon film 17 and the semiconductor substrate 2 can be used in the contact electrode 6, the TiN layer of the first barrier layer 7 becomes unnecessary.

Accordingly, as described above, when the silicide portion 10 is formed at a portion other than the first barrier layer 7, the first barrier layer 7 can be structured solely with the TiN layer, while omitting the Ti layer. Further, use of any contact electrode material that does not diffuse into the semiconductor substrate 2 and the polysilicon film 17 and that possesses excellent adhesion force, in the contact electrode 6 makes it possible to omit the TiN layer of the first barrier layer 7, such that the first barrier layer 7 can be formed solely with the Ti layer. Further, in the case where the silicide portion 10 is formed at a portion other than the first barrier layer 7 and where any contact material that does not diffuse into the polysilicon film 17 and the semiconductor substrate 2 and that possesses excellent adhesion force is used in the contact electrode 6, as shown in FIG. 12, the contact electrode 6 solely can be formed as the contact electrode 6A, without the necessity of forming the first barrier layer 7 itself.

Second Modified Example of the First Embodiment

Figure 13:
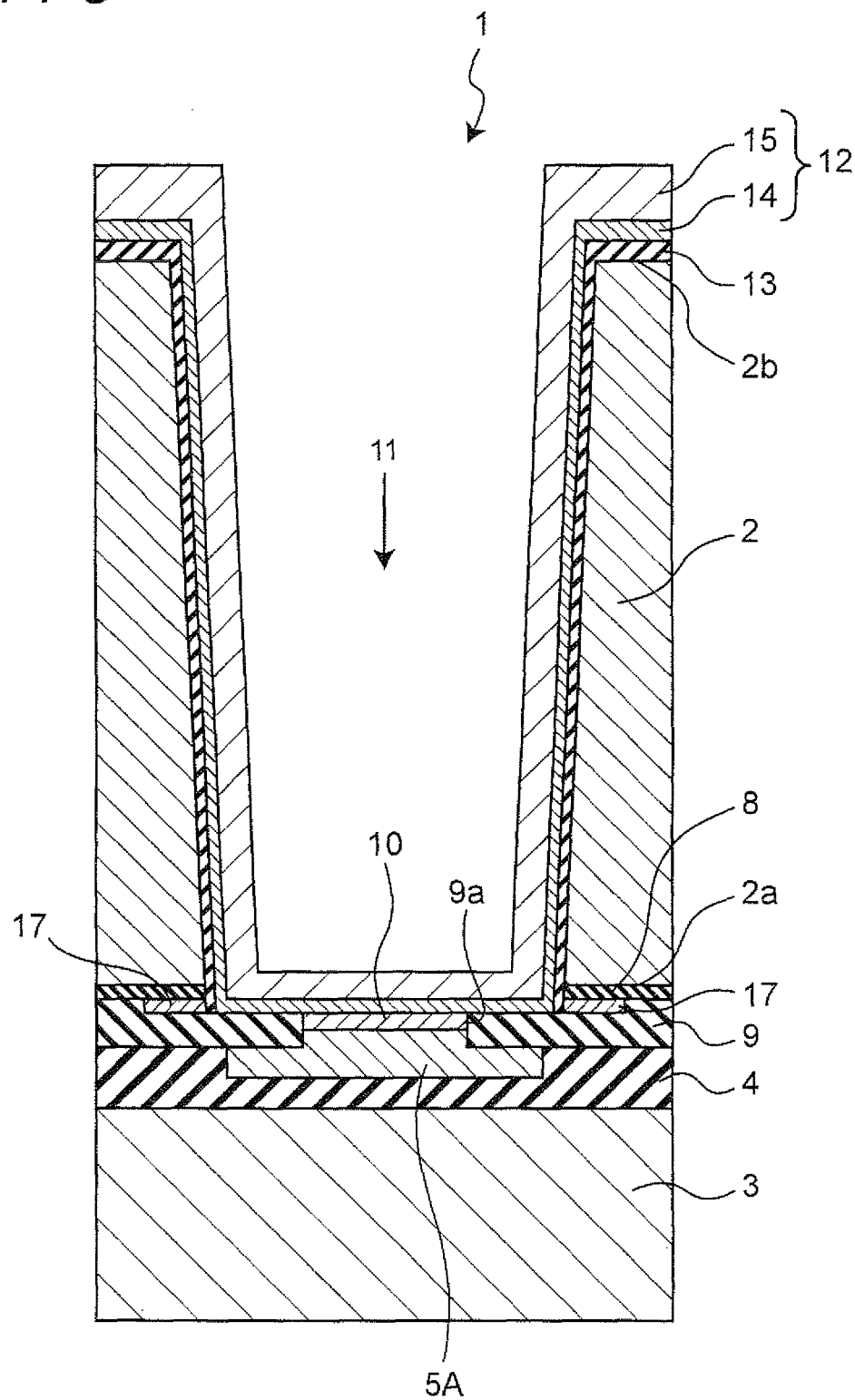
FIG. 13 is a cross-sectional view of a semiconductor device of a second variation according to the first embodiment.

In the first embodiment, the first barrier layer 7, the contact electrode 6, and the pad electrode 5 are separately formed. However, the present invention is not limited thereto. As a second modified example of the first embodiment, as shown in FIG. 13, the first barrier layer 7, the contact electrode 6, and the pad electrode 5 may be integrated so as to be formed as a single pad electrode 5A. Because integration of the first barrier layer 7 and the contact electrode 6 is the same as that of the first modified example, description will chiefly be given of the integration of the contact electrode 6 and the pad electrode 5.

In the first embodiment, the contact electrode 6 is connected to the polysilicon film 17 and the pad electrode 5 at low resistance. The pad electrode 5 is connected to the contact electrode 6 at low resistance. They are necessary from the viewpoint of securing a flat portion when wire bonding is carried out. That is, provision of the pad electrode 5 separately from the contact electrode 6 makes it possible to improve flatness, as compared to a case where the contact electrode 6 solely is employed as an external electrode terminal. However, when the contact electrode 6 and the pad electrode 5 are connected to the polysilicon film 17 at low resistance Kin other words, when the contact electrode 6 and the pad electrode 5 are integrated so as to form the pad electrode 5A as in the second modified example), as shown in FIG. 13, it becomes possible to form a flat plane, forming a vertical cross section of the pad electrode 5A into a convex shape. Further, in a case where wire bonding is not used, the pad electrode 5A is not necessarily flat.

In the first embodiment, the first barrier layer 7, the contact electrode 6, and the pad electrode 5 are separately formed as one resolution to the aforementioned issue in the manufacturing method. Therefore, in a case where such an issue can be resolved, it is also possible to form the pad electrode 5A by integrating the first barrier layer 7, the contact electrode 6, and the pad electrode 5 as in the second modified example.

Third Modified Example of the First Embodiment

Figure 14:
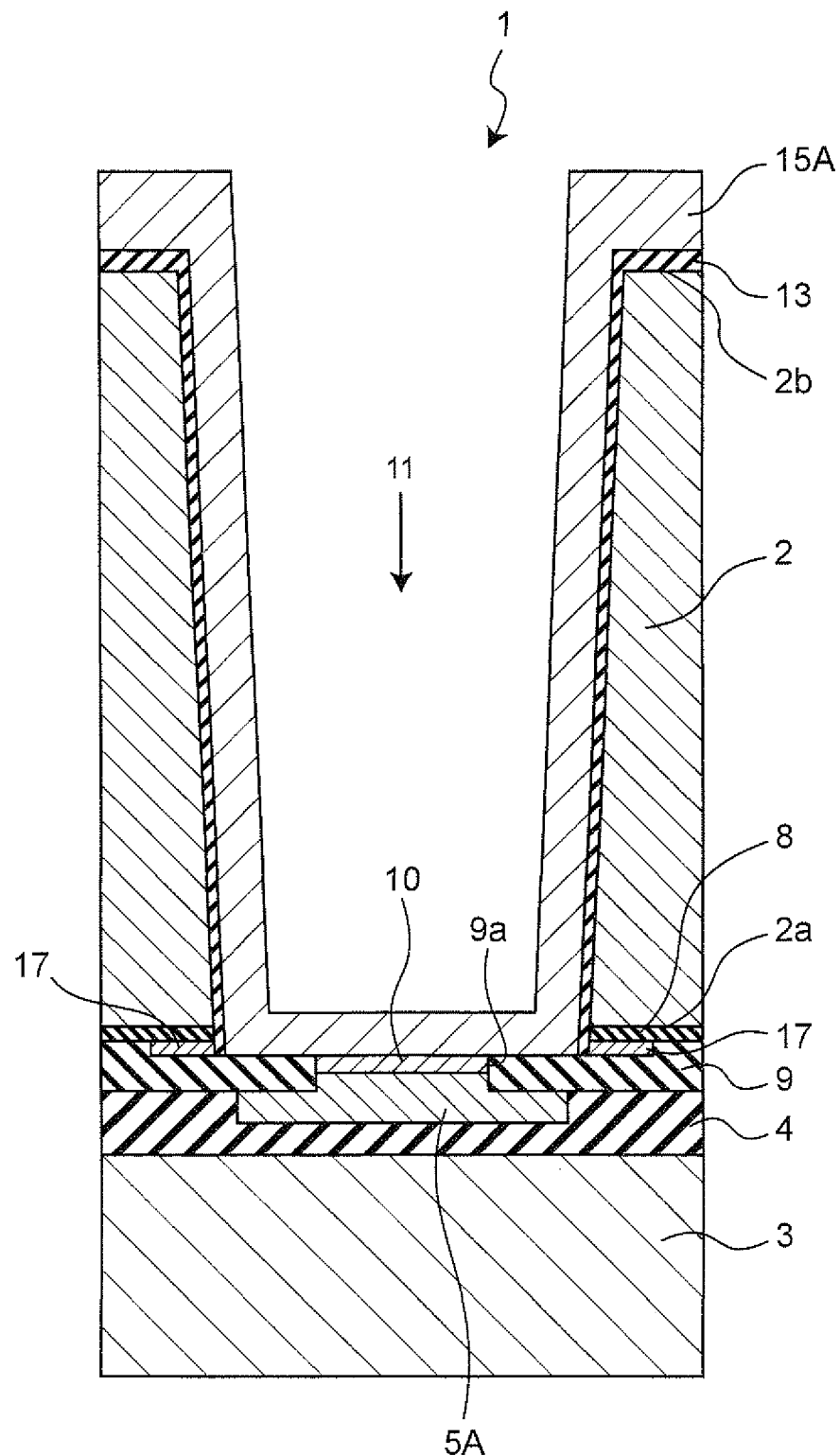
FIG. 14 is a cross-sectional view of a semiconductor device of a third variation according to the first embodiment.

In the first embodiment, the second barrier layer 14 and the rewiring layer 15 are separately formed. However, the present invention is not limited thereto. As a third modified example of the first embodiment, as shown in FIG. 14, the second barrier layer 14 and the rewiring layer 15 may be integrated so as to be formed as a rewiring layer 15A. It is to be noted that, while FIG. 14 shows an application of the third modified example to the second modified example shown in FIG. 13, the present invention is not limited thereto. The third modified example can be also applied to the first modified example.

In the first embodiment, the second barrier layer 14 (e.g., the layer structured with Ti) has a function of preventing diffusion of the rewiring layer 15 into the semiconductor substrate 2 and the polysilicon film 17, and a function of improving adhesion force of the third oxide film 13 and the rewiring layer 15. Further, the rewiring layer 15 (e.g., the layer structured with Cu) is low resistant, and has a function of bearing a solder ball. It is to be noted that, so long as it is possible to use as the rewiring layer 15 a rewiring material that can possess the function of preventing diffusion into the semiconductor substrate 2 and the polysilicon film 17 and that exhibits excellent adhesion force, similarly to the third modified example, as shown in FIG. 14, the rewiring layer 15 can be formed as the rewiring layer 15 solely, while omitting the second barrier layer 14.

In the first embodiment, the second barrier layer 14 and the rewiring layer 15 are separately formed as one resolution to the aforementioned issue in the manufacturing method. Therefore, in a case where such an issue can be resolved, it is also possible to form the rewiring layer 15A by integrating the second barrier layer 14 and the rewiring layer 15 as in the third modified example.

It is to be noted that, the semiconductor substrate 2 is made of a material such as silicon, and it may be electrically conductive, insulating, or semi-insulating.

It is to be noted that, the polysilicon film 17 may remain in the final product in some cases depending on a manufacturing method which will be described later, but may not remain in the final product in other cases.

It is to be noted that the polysilicon film 17 is formed desirably before the second oxide film 9 is formed. Alternatively, the polysilicon film 17 may be formed after the second oxide film 9 is formed.

It is to be noted that, by appropriately combining any of the above-described various embodiments and modified examples, their respective effects can be exerted.

INDUSTRIAL APPLICABILITY

The semiconductor device and the semiconductor device manufacturing method of the present invention provide a through-hole electrode layer whose variations in resistance value are small. The present invention can be widely applied to a semiconductor device in which a through-hole electrode layer is formed in a semiconductor substrate, and to a manufacturing method of the semiconductor device.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The invention claimed is:

1. A semiconductor device manufacturing method, the method comprising:
   forming a first insulating film on a front surface of a semiconductor substrate;
   forming an electrode section in the first insulating film;
   forming a barrier layer that covers the electrode section;
   forming a silicide layer that is connected to the electrode section;
   after said forming the silicide layer and said forming the first insulating film, forming a via hole by etching from a back surface toward the front surface of the semiconductor substrate and by using the first insulating film and the silicide layer as an etching stopping layer;
   forming a second insulating film on a sidewall and a bottom surface of the via hole and on the back surface of the semiconductor substrate;
   etching the second insulating film to expose the silicide layer and the first insulating film in the via hole; and
   forming a through-hole electrode layer at the second insulating film on the sidewall of the via hole, the second insulating film on the back surface of the semiconductor substrate, the first insulating film on the bottom surface of the via hole, and the silicide layer.

2. The semiconductor device manufacturing method according to claim 1, further comprising:
   before said forming the through-hole electrode layer, measuring an electrical characteristic of a circuit formed at the semiconductor substrate using the electrode section.

3. A semiconductor device, comprising:
   a semiconductor substrate having a front surface and a back surface;
   a first insulating film that is formed on the front surface of a semiconductor substrate;
   a contact electrode that is formed in the first insulating film and that is covered by a barrier layer;
   a via hole that penetrates the semiconductor substrate;
   a second insulating film that is formed on a sidewall of the via hole and on the back surface of the semiconductor substrate;
   a through-hole electrode layer formed at the second insulating film on the sidewall of the via hole, the second insulating film on the back surface of the semiconductor substrate, and the first insulating film on a bottom surface of the via hole; and a silicide layer that is formed in the first insulating film and between the contact electrode and the through-hole electrode layer, and that is connected to the contact electrode and to the through-hole electrode layer, wherein the via hole penetrates the second insulating layer, and wherein a relationship between a width A of the silicide layer and a width B of a bottom of the via hole in a cross section taken along a plane including a center axis of the via hole satisfies $A \leq B$.

4. The semiconductor device according to claim 3, wherein a shape of a bottom surface of the through-hole electrode layer is flat, and the bottom surface of the through-hole electrode layer is electrically connected to the contact electrode via the silicide layer.

5. The semiconductor device according to claim 3, wherein a polysilicon film is formed on the front surface of the semiconductor substrate, and a relationship between a diameter C of the polysilicon film and a diameter A of the silicide layer in a cross section taken along a plane including the center axis of the via hole satisfies $C \geq A$.

6. The semiconductor device according to claim 3, wherein the first insulating film is one of an $SiO_2$ film, an oxynitride film, or a nitride film.

7. The semiconductor device according to claim 3, wherein one of a polysilicon film and an amorphous silicon film is formed on the first insulating film.

8. The semiconductor device according to claim 3, wherein the silicide layer is made of any one of tungsten silicide, titanium silicide, cobalt silicide, and nickel silicide.

9. The semiconductor device according to claim 3, wherein the barrier layer is made of one of titanium, titanium nitride, titanium tungsten, tantalum, tantalum nitride, a high melting point metal, and a laminated film made up thereof.

10. The semiconductor device according to claim 3, wherein a polysilicon film is disposed between the front surface of the semiconductor substrate and the first insulating film, and wherein the via hole penetrates the polysilicon film.

11. The semiconductor device of claim 10, wherein the through-hole electrode layer contacts the silicide layer and the first insulating film.

12. The semiconductor device of claim 3, wherein the through-hole electrode layer contacts the silicide layer and the first insulating film.

13. The method of claim 1, further comprising:

forming a polysilicon film on the front surface of the semiconductor substrate, wherein the polysilicon film is disposed between the front surface of the semiconductor substrate and the first insulating film, and the via hole penetrates the polysilicon film.

14. The method of claim 13, wherein the through-hole electrode layer contacts the silicide layer and the first insulating film.

15. The method of claim 1, wherein the through-hole electrode layer contacts the silicide layer and the first insulating film.

* * * * *